(12) United States Patent
Maemura

(10) Patent No.: US 6,934,191 B2
(45) Date of Patent: Aug. 23, 2005

(54) NONVOLATILE SEMICONDUCTOR MEMORY DEVICE

(75) Inventor: Kimihiro Maemura, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/783,019

(22) Filed: Feb. 23, 2004

(65) Prior Publication Data

US 2004/0228181 A1 Nov. 18, 2004

(30) Foreign Application Priority Data

Feb. 28, 2003 (JP) ........................................ 2003-054449

(51) Int. Cl.$^7$ .............................................. G11C 16/06
(52) U.S. Cl. ............................ 365/185.23; 365/185.14; 365/185.05
(58) Field of Search ....................... 365/185.23, 185.14, 365/185.05

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,636,160 A | * 6/1997 | Omino et al. | .......... 365/185.14 |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,587,380 B2 | 7/2003 | Kanai et al. | |

(Continued)

FOREIGN PATENT DOCUMENTS

| | | |
|---|---|---|
| JP | A 6-181319 | 6/1994 |
| JP | A 7-161851 | 6/1995 |
| JP | A 11-074389 | 3/1999 |
| JP | B1 2978477 | 9/1999 |
| JP | A 2001-156188 | 6/2001 |

OTHER PUBLICATIONS

Hayashi, Yutaka et al. "Twin MONOS Cell with Dual Control Gates." 2000 Symposium on VLSI Technology Digest of Technical Papers, 2000 IEEE.
Chang, Kuo–Tung et al. "A New SONOS Memory Using Source–Side Injection for Programming." IEEE Electron Device Letters, vol. 19 No. 7 (pp. 253–254) Jul. 1998.
Chen, Wei–Ming et al. "A Novel Flash Memory Device with SPlit Gate Source Side Injection and ONO Charge Storage Stack (SPIN)." 1997 Symposium on VLSI Technology Digest of Technical Papers (pp. 63–64).
U.S. Appl. No. 10/728,746, filed Dec. 8, 2003, Natori.
U.S. Appl. No. 10/733,455, filed Dec. 12, 2003, Kanai.
U.S. Appl. No. 10/779,683, filed Feb. 18, 2004, Kanai.
U.S. Appl. No. 10/782,950, filed Feb. 23, 2004, Owa.
U.S. Appl. No. 10/782,975, filed Feb. 23, 2004, Maemura.
U.S. Appl. No. 10/782,974, filed Feb. 23, 2004, Owa.

*Primary Examiner*—Huan Hoang
(74) *Attorney, Agent, or Firm*—Oliff & Berridge, PLC

(57) ABSTRACT

A nonvolatile semiconductor memory device having a small layout area includes a memory cell array in which a plurality of memory cells are arranged in a row direction and a column direction, wherein each of the memory cells includes a source region, a drain region, a channel region between the source region and the drain region, a word gate and a select gate disposed to face the channel region, and a nonvolatile memory element formed between the word gate and the channel region, wherein the wordline-and-selectline-driver-section includes a plurality of unit wordline-and-selectline-driver-sections, and wherein each of the unit wordline-and-selectline driver sections drives the select gates and the word gates of the memory cells in each row at a single potential.

10 Claims, 25 Drawing Sheets

U.S. PATENT DOCUMENTS

| | | |
|---|---|---|
| 6,587,381 B2 | 7/2003 | Kanai et al. |
| 6,643,182 B2 * | 11/2003 | Yanagisawa et al. .. 365/185.23 |
| 6,646,916 B2 | 11/2003 | Kamei |
| 6,650,591 B2 | 11/2003 | Owa |
| 6,654,282 B2 | 11/2003 | Kanai |
| 6,697,280 B2 | 2/2004 | Natori |
| 6,704,224 B2 | 3/2004 | Natori |
| 6,707,695 B2 | 3/2004 | Owa |
| 6,707,716 B2 | 3/2004 | Natori |
| 6,707,720 B2 | 3/2004 | Kamei et al. |
| 6,707,742 B2 | 3/2004 | Kamei |
| 6,710,399 B2 | 3/2004 | Kamei |
| 6,717,854 B2 | 4/2004 | Natori |
| 6,738,291 B2 | 5/2004 | Kamei |
| 6,744,106 B2 | 6/2004 | Kanai |
| 6,757,197 B2 | 6/2004 | Kamei |
| 6,760,253 B2 | 7/2004 | Kamei |
| 6,762,960 B2 | 7/2004 | Natori |
| 2002/0191453 A1 | 12/2002 | Owa |
| 2003/0025149 A1 | 2/2003 | Kanai |
| 2003/0025150 A1 | 2/2003 | Kanai et al. |
| 2003/0027411 A1 | 2/2003 | Kanai |
| 2003/0072191 A1 | 4/2003 | Kamei |
| 2003/0072194 A1 | 4/2003 | Kamei |
| 2003/0095443 A1 | 5/2003 | Natori |
| 2003/0151070 A1 | 8/2003 | Natori |
| 2003/0164517 A1 | 9/2003 | Kamei |
| 2003/0174558 A1 | 9/2003 | Kamei |
| 2003/0179609 A1 | 9/2003 | Natori |
| 2003/0198102 A1 | 10/2003 | Kamei |
| 2003/0198103 A1 | 10/2003 | Kamei |
| 2004/0013018 A1 | 1/2004 | Kanai |
| 2004/0013027 A1 | 1/2004 | Kanai |
| 2004/0061139 A1 | 4/2004 | Natori |

* cited by examiner

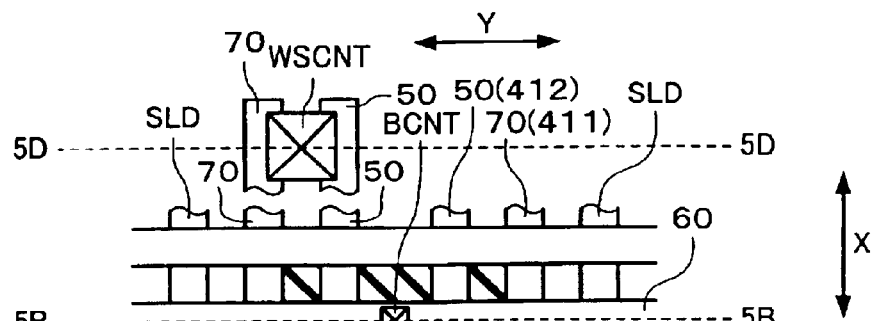
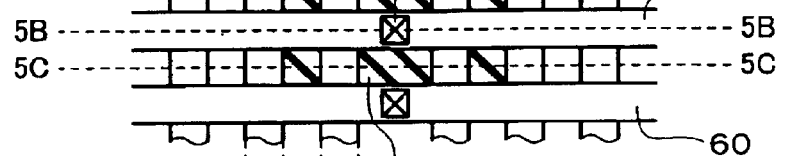
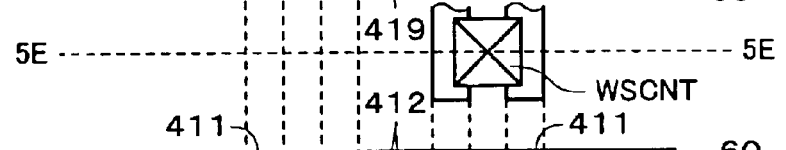
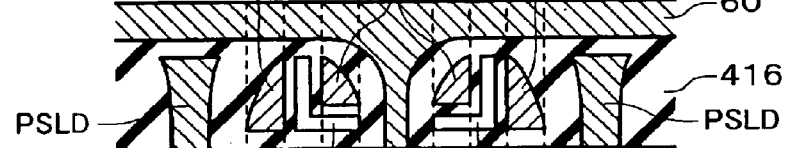
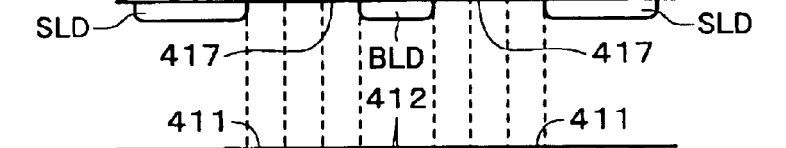
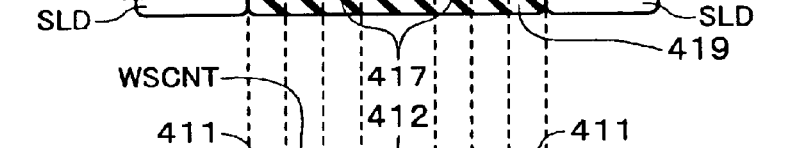
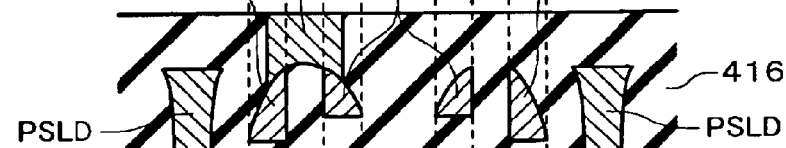
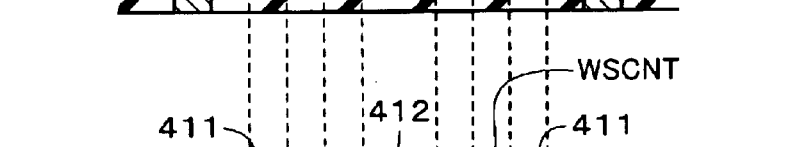
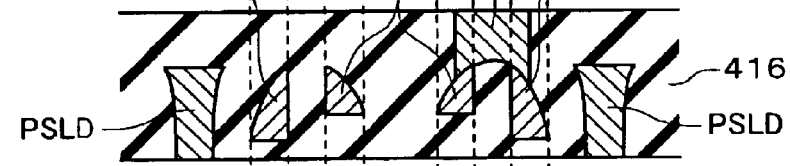

NONVOLATILE SEMICONDUCTOR MEMORY DEVICE

Japanese Patent Application No. 2003-54449, filed on Feb. 28, 2003, is hereby incorporated by reference in its entirety.

BACKGROUND OF THE INVENTION

The present invention relates to a nonvolatile semiconductor memory device including a nonvolatile memory element controlled by a word gate and a select gate.

As an example of a nonvolatile semiconductor memory device, a MONOS (Metal-Oxide-Nitride-Oxide-Semiconductor or -Substrate) nonvolatile semiconductor memory device is known. In the MONOS nonvolatile semiconductor memory device, a gate insulating film between a channel and a gate is formed of a laminate consisting of a silicon oxide film, a silicon nitride film, and a silicon oxide film, and a charge is trapped in the silicon nitride film.

As the MONOS nonvolatile semiconductor memory device, a MONOS flash memory cell including a nonvolatile memory element (MONOS memory element) controlled by one select gate and one control gate is disclosed (see Japanese Patent Application Laid-open No. 6-181319, Japanese Patent Application Laid-open No. 11-74389, U.S. Pat. No. 5,408,115, and U.S. Pat. No. 5,969,383, for example).

BRIEF SUMMARY OF THE INVENTION

The present invention may provide a nonvolatile semiconductor memory device having a small layout area.

According to the present invention, there is provided a nonvolatile semiconductor memory device comprising a memory cell array in which a plurality of memory cells are arranged in a row direction and a column direction, wherein each of the memory cells includes a source region, a drain region, a channel region between the source region and the drain region, a word gate and a select gate disposed to face the channel region, and a nonvolatile memory element formed between the word gate and the channel region, wherein the memory cell array includes:

a plurality of wordlines, each of the wordlines being connected in common with the word gates of the memory cells arranged in the row direction;

a plurality of selectlines, each of the selectlines being connected in common with the select gates of the memory cells arranged in the row direction;

a plurality of bitlines, each of the bitlines being connected in common with the drain regions or the source regions of the memory cells arranged in the column direction;

a wordline-and-selectline driver section which drives the wordlines and the selectlines; and a bitline driver section which drives the bitlines, wherein the wordline-and-selectline-driver-section includes a plurality of unit wordline-and-selectline-driver-sections, and wherein each of the unit wordline-and-selectline driver sections drives the select gates and the word gates of the memory cells in each row at a single potential.

According to the above configuration, since it is unnecessary to separately provide a driver section exclusively for the select gate and a driver section exclusively for the word gate, the layout area can be reduced.

In this nonvolatile semiconductor memory device, a wordline among the wordlines and a selectline among the selectlines may be short-circuited, the wordline and the selectline being connected with the same memory cells. This enables a select gate and a word gate in each of the memory cells to be driven at a single potential.

In this nonvolatile semiconductor memory device, an interconnect contact may be provided over the wordline and the select line, and the interconnect contact may cover a part of an interconnect surface of the wordline and a part of an interconnect surface of the selectline. This enables the wordline and the selectline to be short-circuited through one contact and connected with the driver section, whereby the contact area can be saved.

In this nonvolatile semiconductor memory device, the word gate and the select gate may be capacitively coupled in each of the memory cells.

When the word gate and the select gate are capacitively coupled in each of the memory cells, the wordline-and-selectline-driver-section may supply drive voltages to the wordlines or the selectlines connected with the memory cells.

In this nonvolatile semiconductor memory device, each of the unit wordline-and-selectline-driver-sections may supply drive voltages to a wordline among the wordlines or a selectline among the selectlines connected with the same memory cells.

In this nonvolatile semiconductor memory device, the nonvolatile memory element may be formed to extend between the word gate and the select gate of each of the memory cells.

In this nonvolatile semiconductor memory device, the nonvolatile memory element may be formed of an ONO film which includes two oxide films (O) and a nitride film (N) between the two oxide films (O).

In this nonvolatile semiconductor memory device, each of the memory cells may include a first region and a second region in the channel region, the first region being adjacent to the source region, and the second region being adjacent to the drain region, and the select gate may be disposed over the first region, and the word gate may be disposed over the second region with the nonvolatile memory element interposed in between.

Alternatively, each of the memory cells may include a first region and a second region in the channel region, the first region being adjacent to the source region, and the second region being adjacent to the drain region, and the word gate may be disposed over the first region with the nonvolatile memory element interposed in between, and the select gate may be disposed over the second region.

BRIEF DESCRIPTION OF THE SEVERAL VIEWS OF THE DRAWING

FIG. 5A is a view showing a part of a plane of a memory block according to an embodiment of the present invention.

FIG. 5B is a cross-sectional view along the dotted line 5B—5B in FIG. 5A.

FIG. 5C is a cross-sectional view along the dotted line 5C—5C in FIG. 5A.

FIG. 5D is a cross-sectional view along the dotted line 5D—5D in FIG. 5A.

FIG. 5E is a cross-sectional view along the dotted line 5E—5E in FIG. 5A.

DETAILED DESCRIPTION OF THE EMBODIMENT

An embodiment of the present invention is described below with reference to the drawings.

1. Entire Configuration and Memory Block

Figure 1:
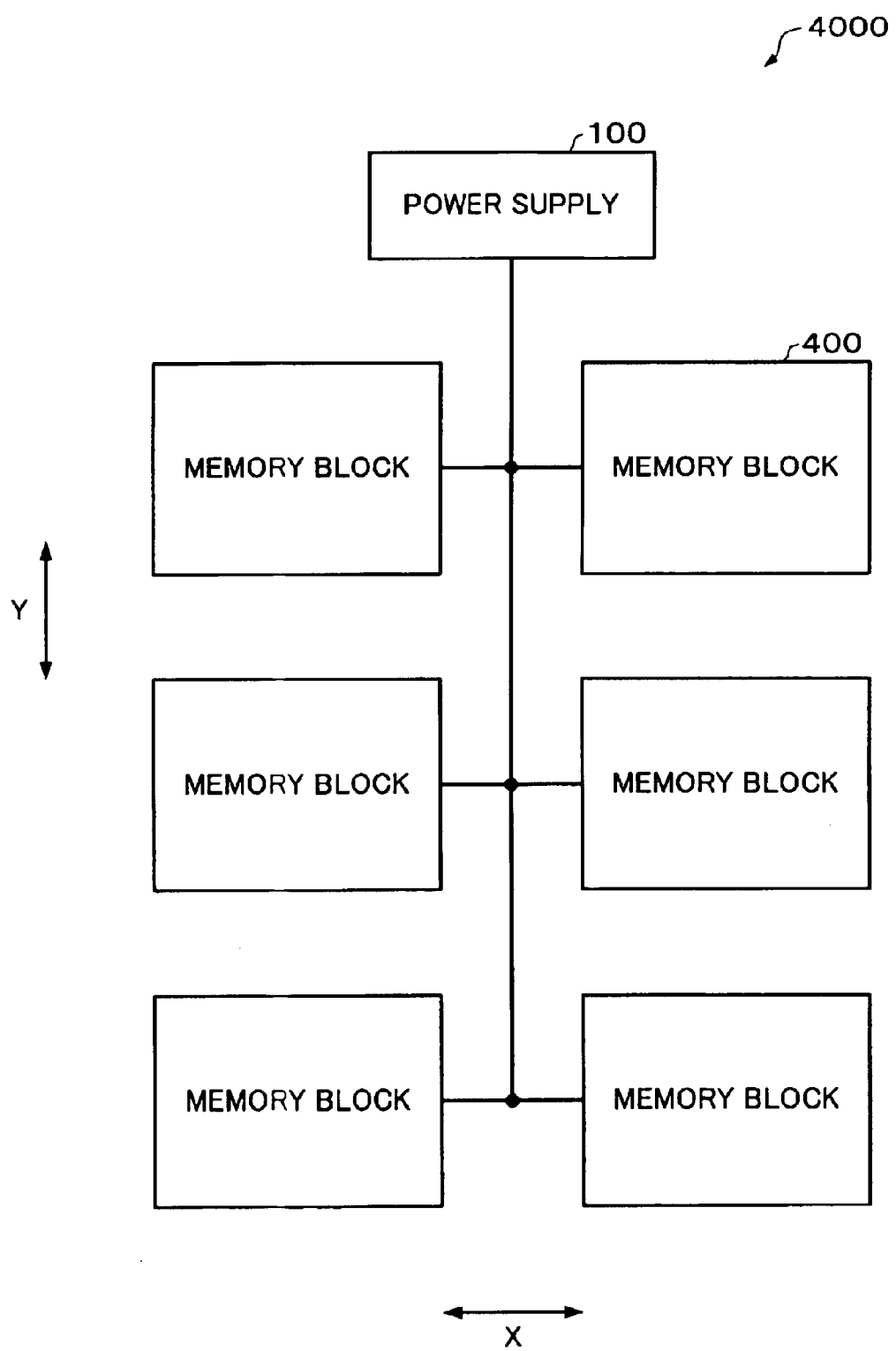
FIG. 1 is an overall diagram according to an embodiment of the present invention.

FIG. 1 is a block diagram showing the entire configuration of the present embodiment. A memory cell array 4000 includes a plurality of memory cells 410 (illustrated later) arranged along a row direction X and a column direction Y. The memory cell array 4000 includes a plurality of memory blocks 400. A plurality of types of voltages are generated by a power supply circuit 100. The voltages generated by the power supply circuit 100 are supplied to the memory blocks 400 through a plurality of voltage supply lines. The memory cell array 4000 includes a bitline driver section (not shown) which drives bitlines 60 (illustrated later) in the memory cell array 4000.

Figure 2:
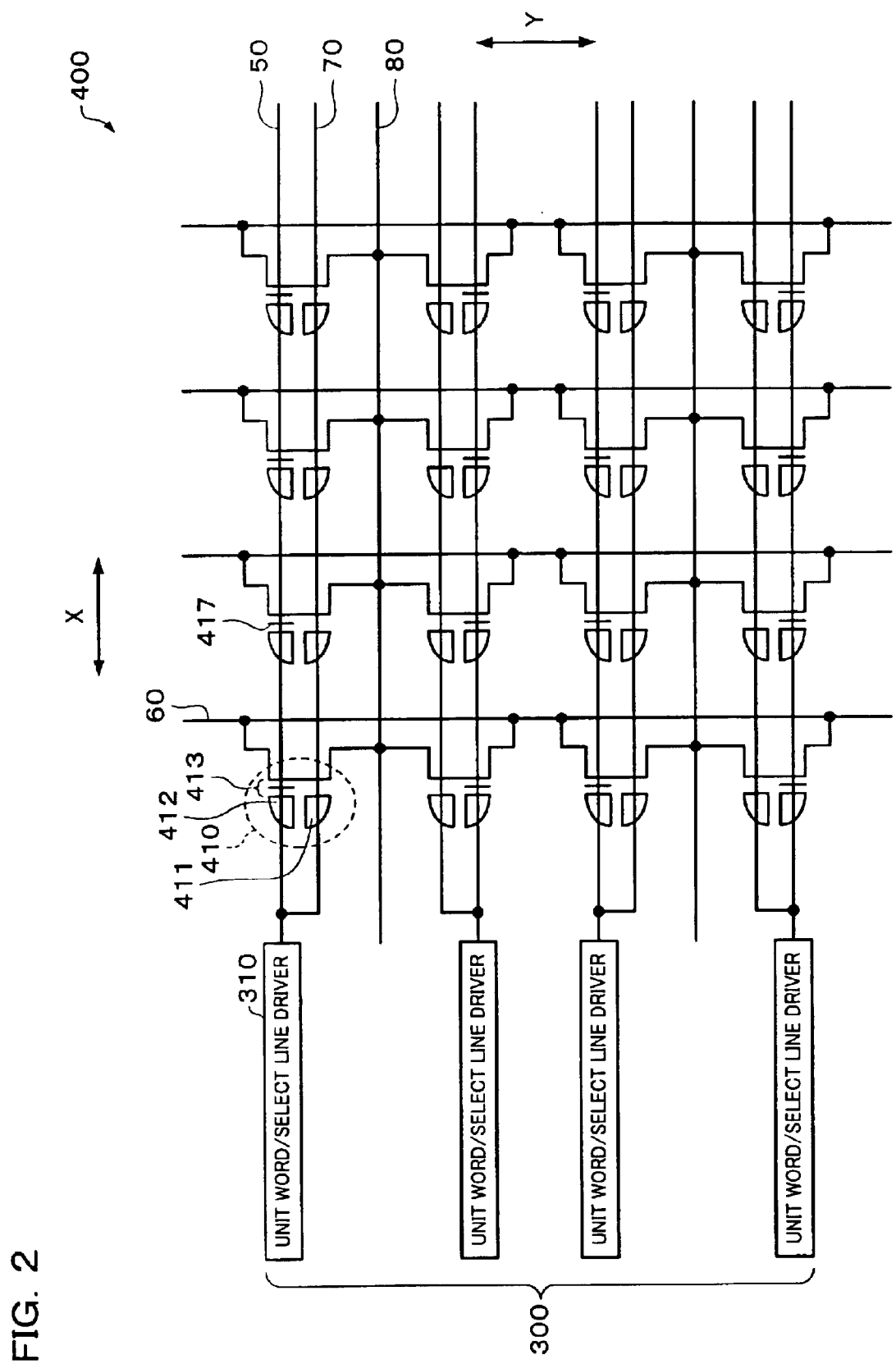
FIG. 2 is a configuration diagram of a memory block of the present invention.

FIG. 2 is a circuit diagram showing a part of the memory block 400. The memory block 400 includes a plurality of wordlines 50, a plurality of bitlines 60, a plurality of selectlines 70, a plurality of source lines 80, and a plurality of memory cells 410. The memory block 400 includes a wordline-and-selectline-driver-section 300 and a source line driver section (not shown). In FIG. 2, the area encircled by a dotted line indicates the memory cell 410.

The memory cell 410 includes a select gate 411, a word gate 412, and an ONO film 413. A numeral 417 indicates a nitride film which makes up the ONO film 413 (see also FIG. 3). The structure of the memory cell 410 is described later in detail.

The wordline-and-selectline-driver-section 300 includes a plurality of unit wordline-and-selectline-driver-sections 310. The wordline 50 connects in common the word gates 412 of the memory cells 410 disposed in the memory block 400 along the row direction X. The selectline 70 connects in common the select gates 411 of the memory cells 410 connected in common by the wordline 50 along the row direction X.

In FIG. 2, the wordline 50 and the selectline 70 are connected in common with the unit wordline-and-selectline-driver-section 310. Specifically, the select gate 411 and the word gate 412 of the memory cell 410 are driven by the unit wordline-and-selectline-driver-section 310 using a single signal. This enables the layout area to be reduced in comparison with the case of separately providing unit driver sections for the wordline 50 and the selectline 70.

The bitline 60 connects in common bitline diffusion layers BLD (illustrated later) of the memory cells 410 in the column direction Y. The source line 80 connects in common source line diffusion layers SLD (illustrated later) of the memory cells 410 in the row direction X.

Figure 3:
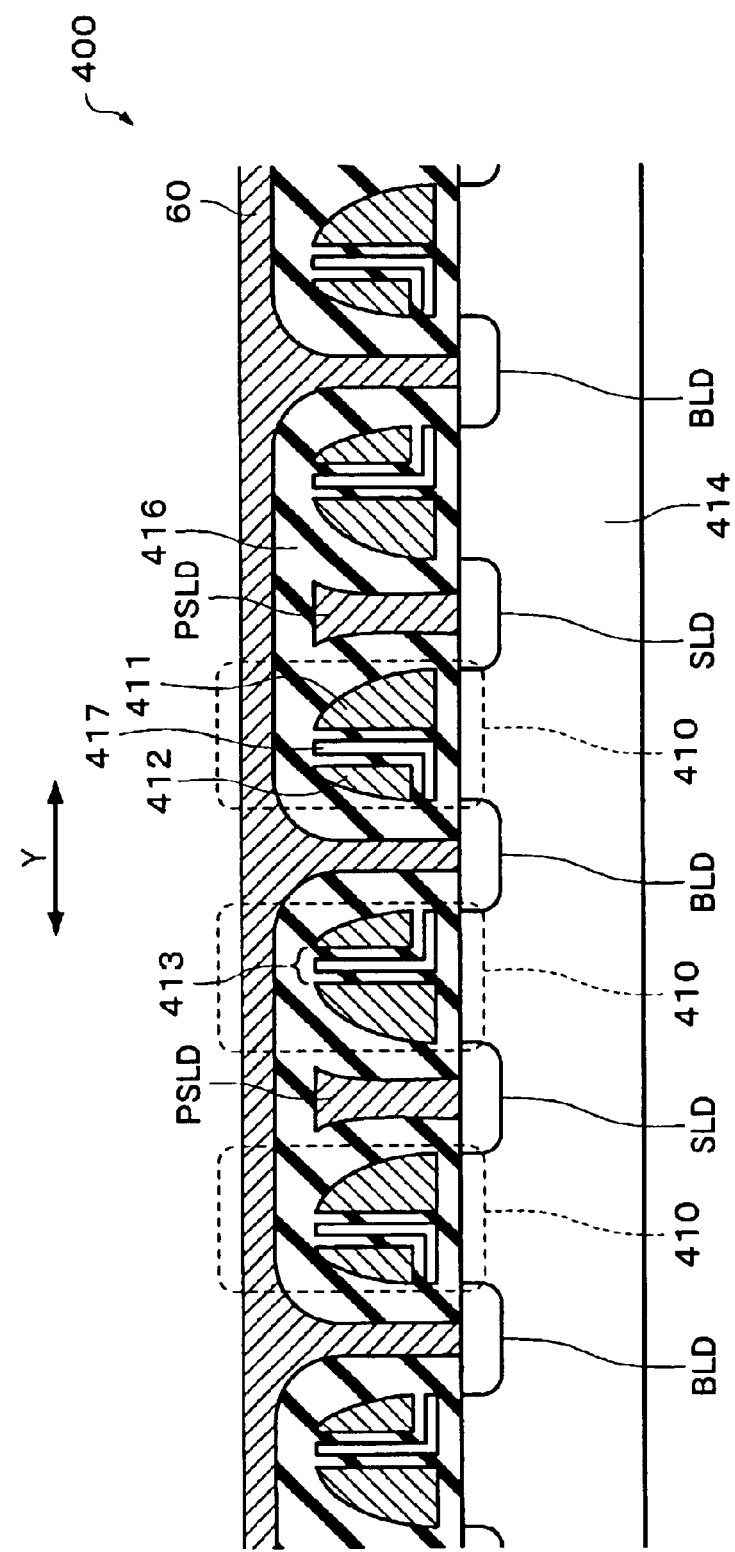
FIG. 3 is a cross-sectional structural diagram of a memory block according to an embodiment of the present invention.
Figure 4:
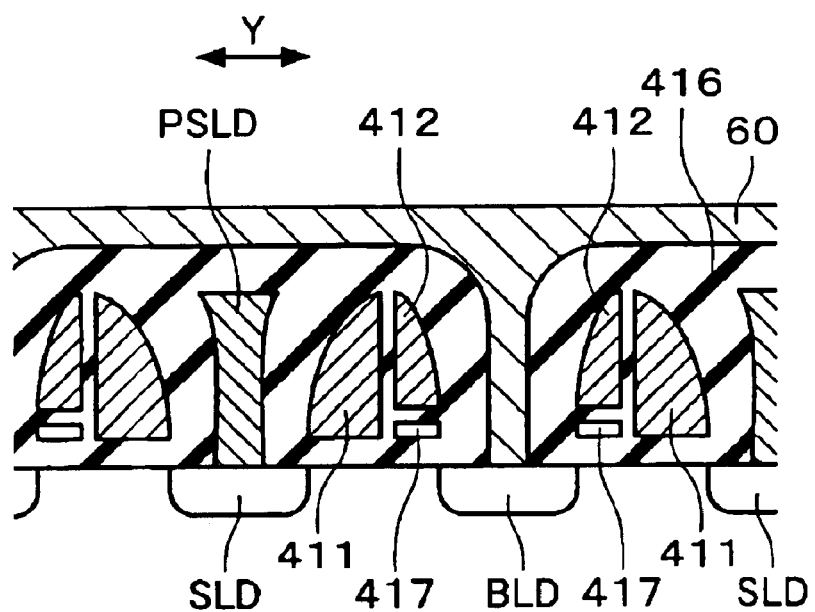
FIG. 4 is another cross-sectional structural diagram of a memory block according to an embodiment of the present invention.

FIG. 3 is a cross-sectional view of a part of the memory block 400. A numeral 414 indicates a substrate. The bitline 60 may be formed of a conductor (metal, for example). The select gate 411 and the word gate 412 are disposed on a channel region between source/drain regions (diffusion layers indicated by the symbol BLD or SLD in FIG. 3) through an insulator film ($SiO_2$, for example). The insulator film may be formed of a nitride oxide film. The nitride film 417 (SiN, for example) is formed between the word gate 412 and the channel region in the shape of the letter "L" (or inverted L shape). The select gate 411 and the word gate 412 may be formed of polysilicon. The ONO film 413 has a structure in which the nitride film 417 is sandwiched between insulator films 416 ($SiO_2$, for example). As shown in FIG. 4, the nitride film 417 of the memory cell 410 need not be formed to extend between the select gate 411 and the word gate 412.

A silicide (not shown) may be formed on the surfaces of the select gate 411 and the word gate 412. A Co silicide or Ti silicide may be used as the silicide (not shown), for example. This enables the resistance of the select gate 411 and the word gate 412 to be reduced. A symbol PSLD indicates a poly plug (plug made of polysilicon). The poly plug PSLD may be formed of a conductor other than polysilicon. The poly plug PSLD has an effect of reducing the resistance of the source line diffusion layer SLD. The bitline diffusion layer BLD is shared by two memory cells 410 disposed on either side of the bitline diffusion layer in the column direction Y. The source line diffusion layer SLD is shared by two memory cells 410 disposed on either side of the source line diffusion layer SLD in the column direction Y. In the cross section shown in FIG. 3, the bitline diffusion layers BLD are connected in common with the bitline 60 along the column direction Y. In the drawings, sections indicated by the same symbols as in FIG. 3 have the same meanings as in FIG. 3.

The bitline diffusion layer BLD and the source line diffusion layer SLD may each be replaced by the other differing from the above structure. In this case, the output voltage of the bitline driver section (not shown) and the output voltage of the source line driver section (not shown) may each be replaced by the other. This configuration is described later as a modification of the present embodiment.

FIGS. 5A to 5E are views showing a plane and sections of a part of the memory block 400 in the present embodiment. The sections along the dotted lines 5B—5B to 5E—5E are respectively shown in FIGS. 5B to 5E. The wordline 50 and the selectline 70 in FIG. 5A are respectively the same as the word gate 412 and the select gate 411 in FIGS. 5B to 5E.

Since the bitline 60 is formed in a layer differing from those of the wordline 50, the selectline 70, and the source line diffusion layer SLD, the bitline 60 is electrically insulated from the wordline 50, the selectline 70, and the source line diffusion layer SLD (see FIG. 5B). The bitline 60 is connected with the bitline diffusion layers BLD in the lower layer through bitline contacts BCNT (see FIG. 5B). The bitline diffusion layers BLD are insulated by an element isolation section 419 in units of bitline contacts BCNT so that the bitlines 60 are electrically insulated (see FIG. 5A). As shown in FIG. 5C, the element isolation section 419 may be formed by shallow-trench-isolation (STI), for example. The bitlines 60 connected with the bitline diffusion layers BLD can be insulated by insulating the bitline diffusion layers BLD by the element isolation sections 419 (see FIG. 7).

A symbol WSCNT indicates a contact which connects the wordline 50 and the selectline 70 adjacent to the wordline 50 with an upper layer (unit wordline-and-selectline-driver-section 310) at the same time. Specifically, the contact WSCNT is an interconnect contact which is formed to cover the interconnect surfaces of the wordline 50 and the selectline 70 connected with the memory cells 410.

As shown in FIG. 5A, the contacts WSCNT (hereinafter may be called "batting contacts") may be alternately disposed on either end of the memory block 400 in the row direction X. The contacts WSCNT may be uniformly disposed on one side in the row direction X. In FIG. 5A, the wordline 50 and the selectline 70 are connected with the unit wordline-and-selectline-driver-section 310 through the contact WSCNT (batting contact). Since one contact is shared to connect the wordline 50 and the selectline 70 with the unit wordline-and-selectline-driver-section 310, the layout area can be reduced. The wordline 50 and the selectline 70 may be connected with the unit wordline-and-selectline-driver-section 310 by separately disposing contacts for the wordline 50 and the selectline 70.

As shown in FIGS. 5D and 5E, the selectline 70 (select gate 411) and the wordline 50 (word gate 412) are connected in common with the upper layer section through the contact WSCNT.

Figure 6:
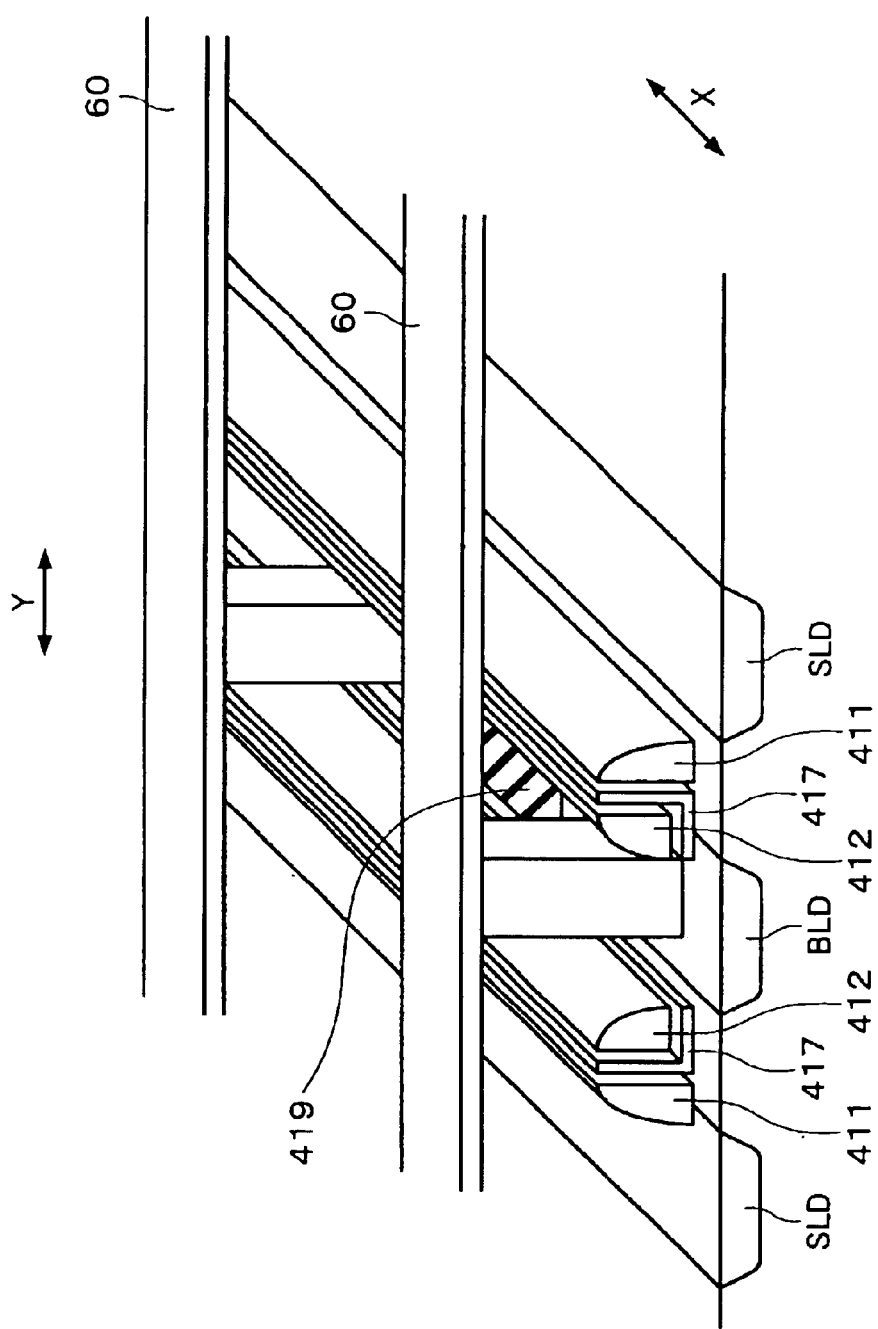
FIG. 6 is a schematic perspective view three-dimensionally showing FIG. 5A.

FIG. 6 is a schematic perspective view three-dimensionally showing a part of FIG. 5A. In FIG. 6, the bitline diffusion layers BLD are isolated in the row direction X by the element isolation section 419 (shallow-trench-isolation (STI), for example). This enables the bitlines 60 to be electrically isolated in units of memory cells 410 arranged along the row direction X. Since the word gate 412 is continuously formed in the row direction X, the word gate 412 may be used as the wordline 50. A metal interconnect may be backed along the word gate 412, and the metal interconnect may be used as the wordline 50.

In the case of the configuration shown in FIG. 3, it is also possible to use a method in which the selectline 70 is set at a floating state, and the wordline 50 is connected with the unit wordline-and-selectline-driver-section 310 by disposing a contact for the wordline 50 (hereinafter called "select gate floating method"). In the case where the memory cell 410 has the configuration shown in FIG. 3, when a voltage is applied to the word gate 412, the select gate 411 is charged to approximately the same voltage as the word gate 412 by a capacitive coupling effect. Specifically, it suffices to dispose the contact for connection with the unit wordline-and-selectline-driver-section 310 for the wordline 50, and it is unnecessary to dispose the contact for the selectline 70.

Figure 7:
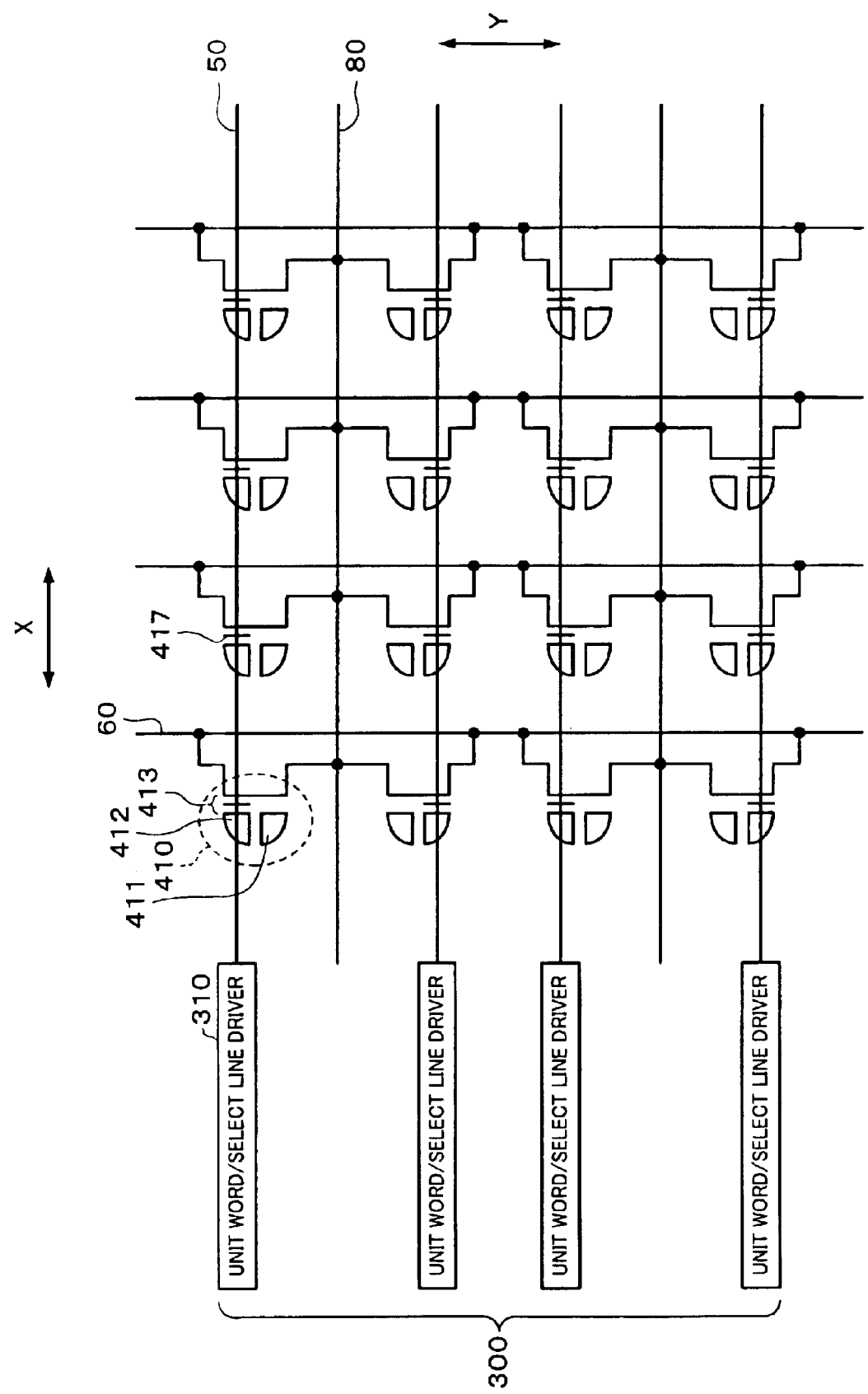
FIG. 7 is a partial view of a memory block having the cross-sectional structure shown in FIG. 4.

In FIG. 3, since the ONO film 413 is formed to extend between the word gate 412 and the select gate 411 of the memory cell 410, the capacitive coupling effect occurs. Specifically, the select gate floating method can be used if a dielectric film which causes the capacitive coupling effect to occur is formed between the word gate 412 and the select gate 411 of the memory cell 410. FIG. 7 is a partial view of the memory block in the case of using the select gate floating method in the above embodiment.

2. Description of Operation

In the present embodiment, the memory cell 410 is accessed in units of memory blocks 400. Specifically, the memory cell 410 is selected by selecting one memory block 400, and selecting one memory cell 410. The memory cell 410 selected is called a selected memory cell. The memory block 400 including the selected memory cell is called a selected memory block, and the memory blocks 400 other than the selected memory block are called unselected memory blocks.

The wordline 50 selected from among the plurality of wordlines 50 is called a selected wordline, and the wordlines 50 other than the selected wordline are called unselected wordlines. The bitline 60 selected from among the plurality of bitlines 60 is called a selected bitline, and the bitlines 60 other than the selected bitline are called unselected bitlines. The selectline 70 selected from among the plurality of selectlines 70 is called a selected selectline, and the selectlines 70 other than the selected selectline are called unselected selectlines. The source line 80 selected from among the plurality of source lines 80 is called a selected source line, and the source lines 80 other than the selected source line are called unselected source lines.

The wordlines 50, the bitlines 60, the selectlines 70, and the source lines 80 in the unselected memory block are set at 0 V in all operations. A standby operation, an erase operation, a program operation, and a read operation are described below with reference to the drawings.

2.1. Standby

Figure 8:
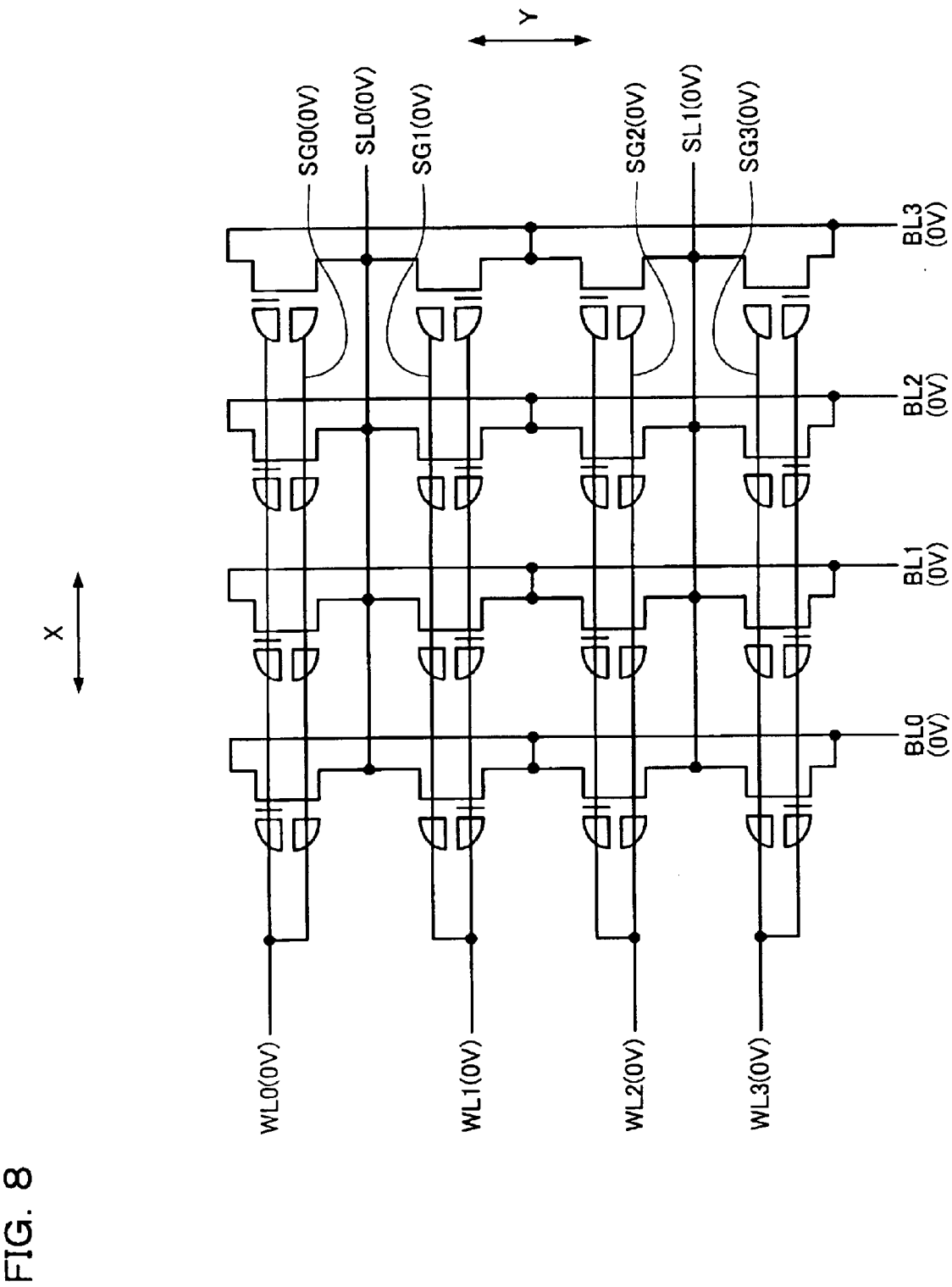
FIG. 8 is a view showing a voltage application state during standby according to an embodiment of the present invention.

FIG. 8 is a view showing a part of the memory block 400 together with the voltage application state during standby. Symbols WL0 to WL3 indicate the wordlines 50. Symbols BL0 to BL3 indicate the bitlines 60. Symbols SG0 to SG3 indicate the selectlines 70. Symbols SL0 and SL1 indicate the source lines 80. In the drawings, sections indicated by the same symbols as in FIG. 8 have the same meanings as in FIG. 8.

All the wordlines WL0 to WL3 are set at a standby word-select voltage (0 V). Since the selectlines SG0 to SG3 are respectively connected with the corresponding wordlines WL0 to WL3, the standby word-select voltage (0 V) is applied to all the selectlines SG0 to SG3. All the bitlines BL0 to BL3 are set at a standby bit voltage (0 V). All the source lines SL0 and SL1 are set at a standby source voltage (0 V).

All the memory cells 410 in the memory cell array 4000 (in the selected memory block and the unselected memory blocks) are set at the above-described voltage application state during standby.

2.2. Erase

Figure 9:
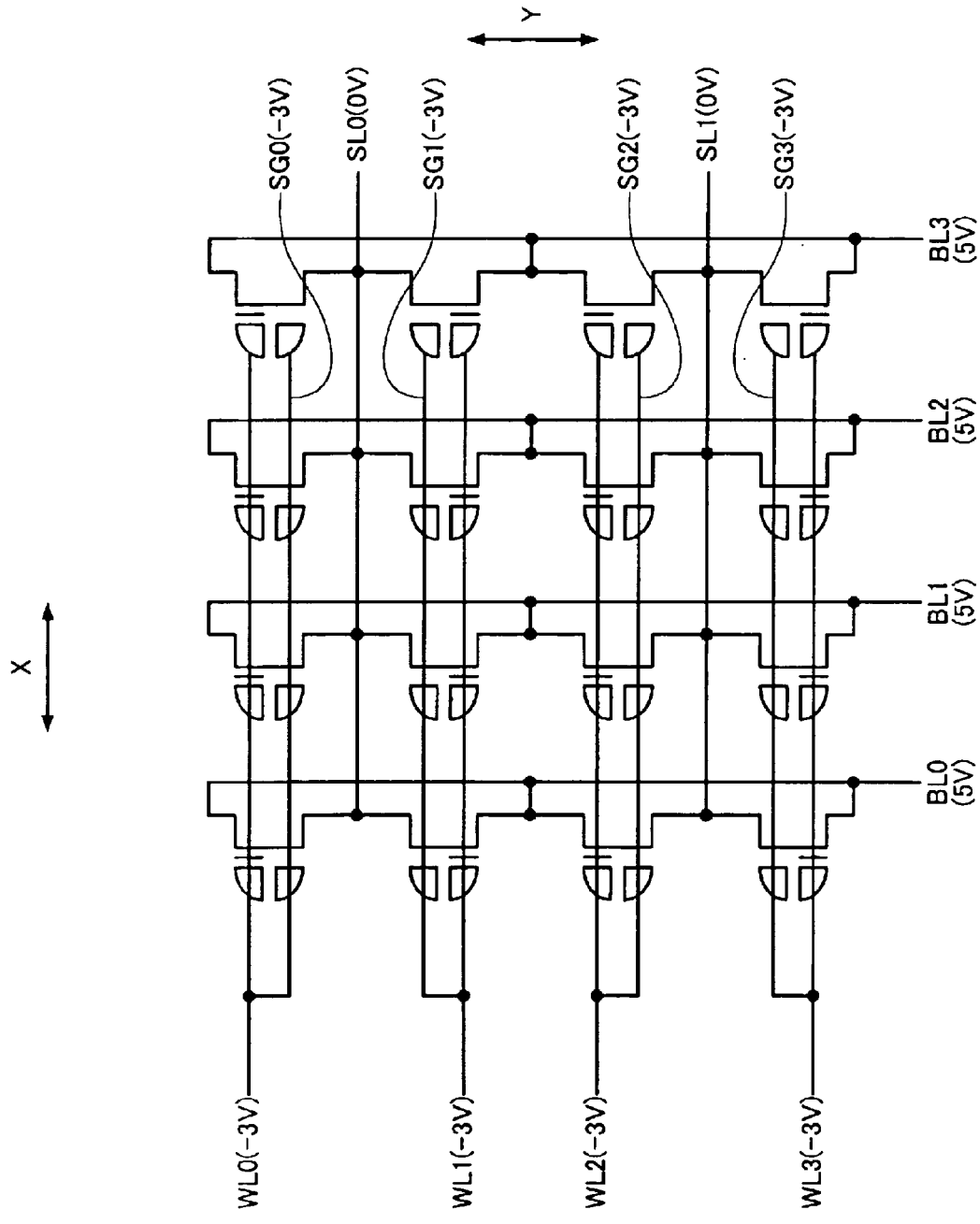
FIG. 9 is a view showing a voltage application state during erasing according to an embodiment of the present invention.

FIG. 9 is a view showing a part of the memory block 400 together with the voltage application state during erasing.

The erase operation is performed for all the memory cells 410 in the selected memory block. Specifically, all the memory cells 410 in the selected memory block are selected memory cells. All the wordlines 50 (including the wordlines WL0 to WL3) and the selectlines 70 (including the selectlines SG0 to SG3) in the selected memory block are charged to an erase word-select voltage (−3 V). All the source lines 80 (including the source lines SL0 and SL1) in the memory block are charged to an erase source voltage (0 V). All the bitlines 60 (including the bitlines BL0 to BL3) in the memory block are set to an erase bit voltage (5 V). An erase substrate voltage (0 V) is applied to the substrate 414 in the selected memory block.

The above-described voltage application state causes a channel to be formed in the channel region between the source line diffusion layer SLD and the bitline diffusion layer BLD. However, since the word gate 412 of the memory cell 410 in the selected block is charged to the erase word-select voltage (−3 V), an electric field is generated between the word gate 412 and the bitline diffusion layer BLD. The charge (electrons) which has been trapped in the ONO film 413 can be erased by hot holes generated by the application of the electric field.

Since the erase word-select voltage (−3 V) is also applied to the select gate 411 of the memory cell 410 in the selected memory block, an electric field is generated between the select gate 411 and the source line diffusion layer SLD. Therefore, in the above-described voltage application method, the erase bit voltage applied to the bitline 60 may be set at 0 V, and the erase source voltage applied to the source line 80 may be set at 5 V, for example.

Figure 10:
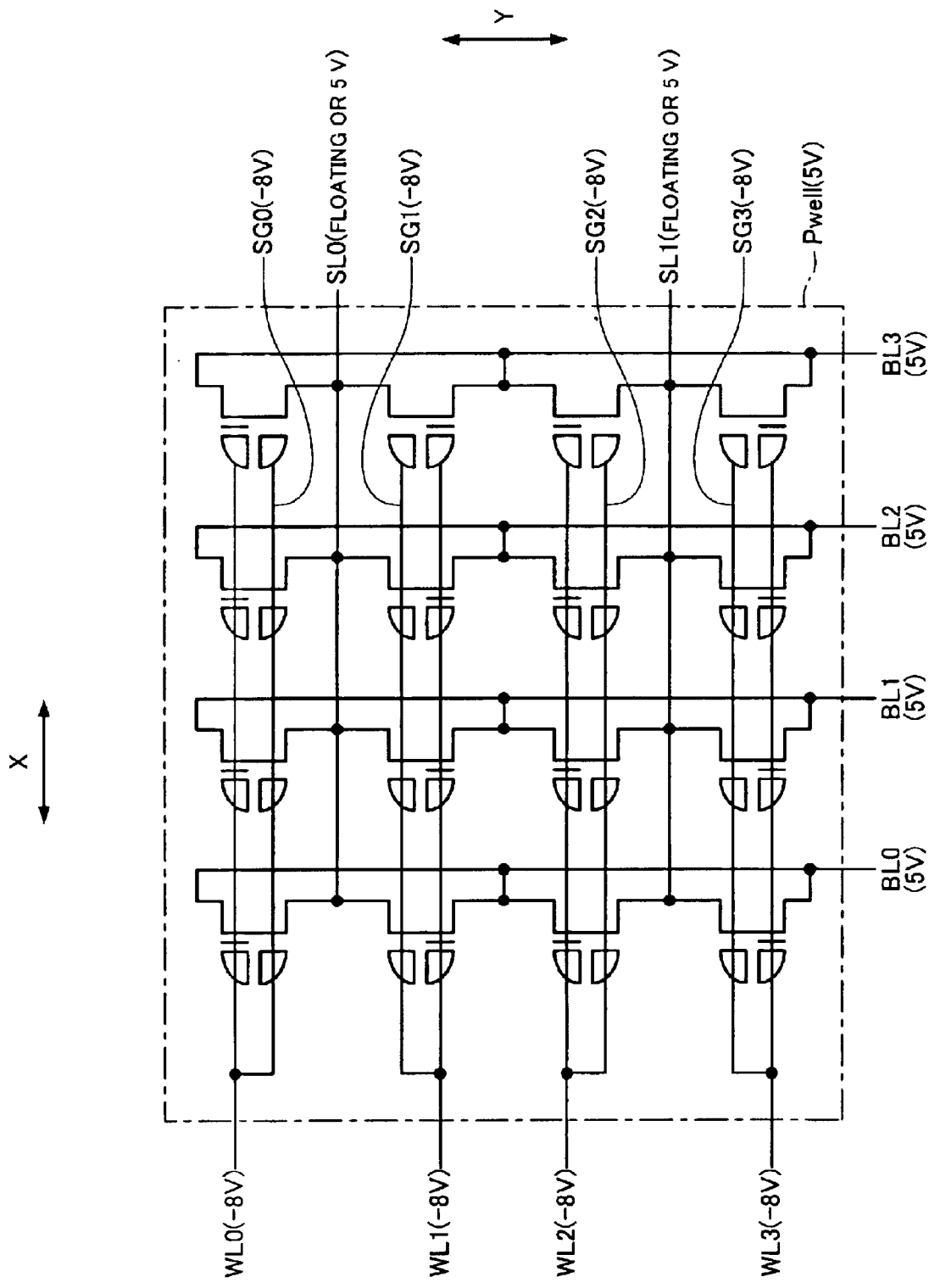
FIG. 10 is a view showing a voltage application state during FN erasing according to an embodiment of the present invention.

In the present embodiment, data is erased by using hot holes. However, data may be erased by using a Fowler-Nordheim (FN) erase method. FIG. 10 shows the voltage application state during FN erasing.

In FIG. 10, all the wordlines 50 (including the wordlines WL0 to WL3) and the selectlines 70 (including the selectlines SG0 to SG3) in the selected memory block are charged to an FN erase word-select voltage (−8 V). All the source lines 80 (including the source lines SL0 and SL1) in the selected memory block are set at a floating state or at an FN erase source voltage (5 V). All the bitlines 60 (including the bitlines BL0 to BL3) in the selected memory block are set at an erase bit voltage (5 V). An FN erase substrate voltage (5 V) is applied to the substrate 414 (symbol Pwell in FIG. 10) in the selected memory block. The FN erase method uses FN tunneling. The principle of this method is that the charge (electrons) in the ONO film 413 is released to the outside the ONO film 413 by a tunnel effect by applying a given electric field (voltage difference of 15 V, for example) to the ONO film 413.

The unselected memory block during the erase operation (erase by hot holes and FN erase) is in the same voltage application state as the standby state.

2.3. Program

Figure 11:
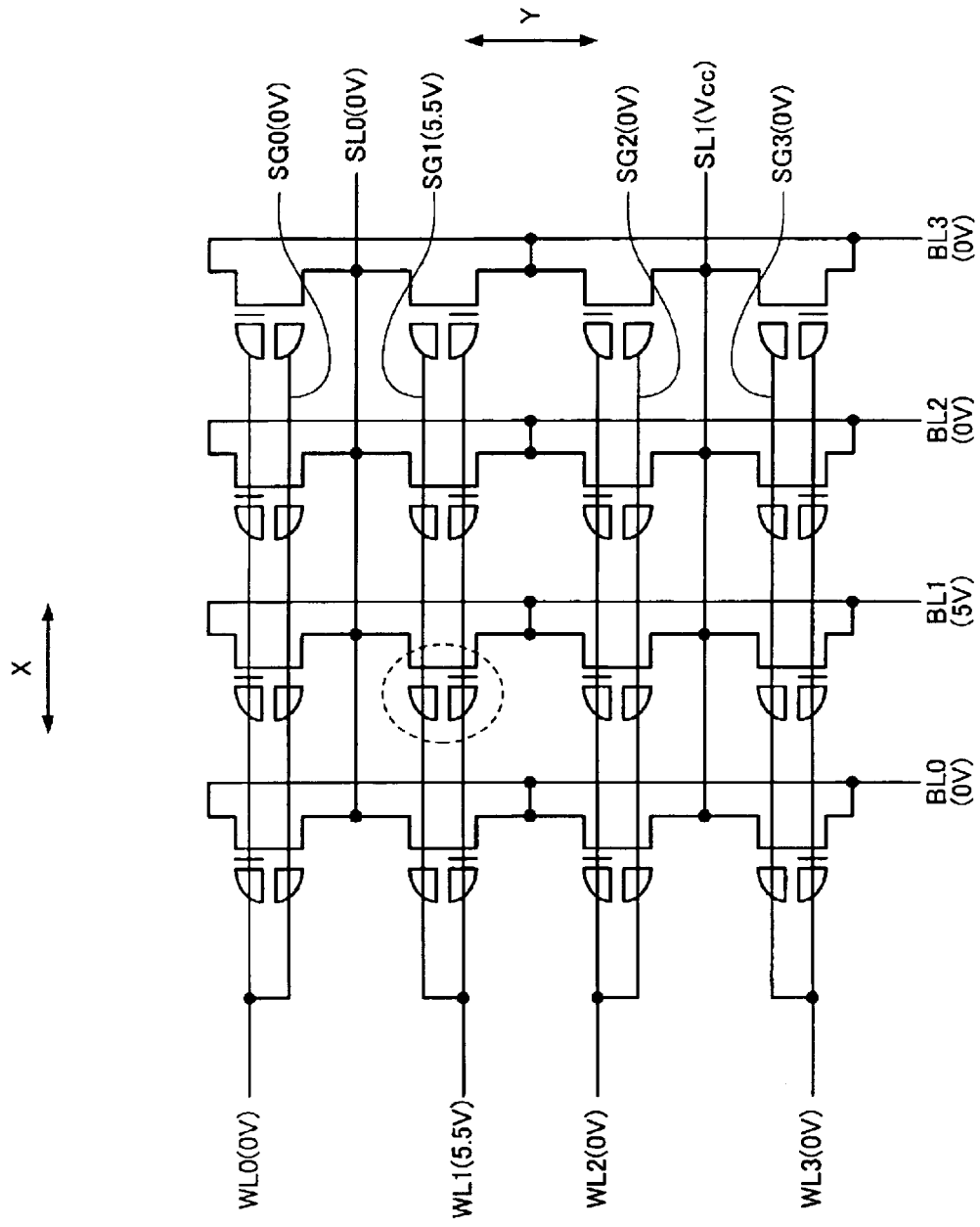
FIG. 11 is a view showing a voltage application state during programming according to an embodiment of the present invention.

FIG. 11 is a view showing a part of the memory block 400 together with the voltage application state during programming. The memory cell 410 encircled by a dotted line is a selected memory cell.

In FIG. 11, the wordline WL1 (selected wordline) and the selectline SG1 (selected selectline) are charged to a program selected word-select voltage (5.5 V). The source line SL0 (selected source line) is charged to a program selected source voltage (0 V), and all the unselected source lines including the source line SL1 are set at a program unselected source voltage (Vcc). The selected bitline including the bitline BL1 is set at a program selected bit voltage (5 V), and other bitlines 60, that is, all the unselected bitlines in the selected memory block are set at a program unselected bit voltage (0 V). All the unselected wordlines in the selected memory block including the wordlines WL0, WL2, and WL3 and all the unselected selectlines in the selected memory block including the selectlines SG0, SG2, and SG3 are set at a program unselected word-select voltage (0 V). A program substrate voltage (0 V) is applied to the substrate 414 in the selected memory block.

The above-described voltage application state causes a channel to be formed in the channel region between the source line diffusion layer SLD and the bitline diffusion layer BLD on either side of the selected memory cell. Since the select gate 411 of the selected memory cell is charged to the program selected word-select voltage (5.5 V), electrons injected into the channel region become hot electrons. Since the word gate 412 of the selected memory cell is charged to the program selected word-select voltage (5.5 V), the hot electrons are drawn toward the word gate 412. The hot electrons drawn toward the word gate 412 are trapped in the ONO film 413. This is the principle of writing (programming) data into the selected memory cell.

2.4. Read

Figure 12:
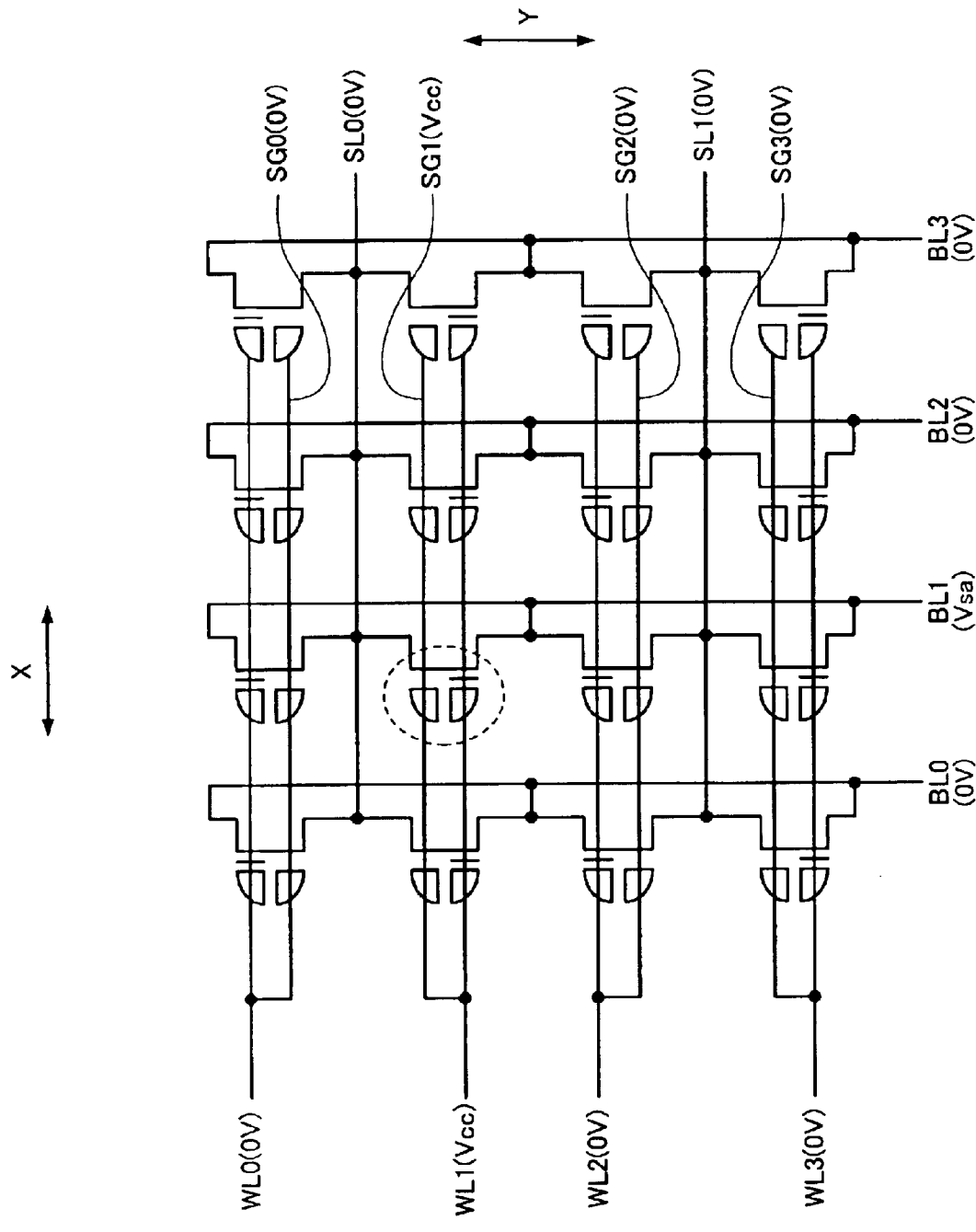
FIG. 12 is a view showing a voltage application state during forward reading according to an embodiment of the present invention.

FIG. 12 is a view showing a part of the memory block 400 together with the voltage application state during reading. The memory cell 410 encircled by a dotted line is a selected memory cell.

In FIG. 12, the wordline WL1 (selected wordline) and the selectline SG1 (selected selectline) are charged to a read selected word-select voltage (power supply voltage Vcc). All the source lines 80 including the source lines SL0 and SL1 are set at a read selected source voltage (0 V). All the selected bitlines including the bitline BL1 are set at a read selected bit voltage (Vsa, 1 V, for example), and other bitlines 60, that is, all the unselected bitlines in the selected memory block are set at a read unselected bit voltage (0 V). All the unselected wordlines in the selected memory block including the wordlines WL0, WL2, and WL3 and all the unselected selectlines in the selected memory block including the selectlines SG0, SG2, and SG3 are set at a read unselected word-select voltage (0 V). A read substrate voltage (0 V) is applied to the substrate 414 in the selected memory block.

The above-described voltage application state causes a channel to be formed in the channel region between the source line diffusion layer SLD and the bitline diffusion layer BLD on either side of the selected memory cell. Since the word gate 412 of the selected memory cell is charged to the read selected word-select voltage (Vcc), electrons injected into the channel region become hot electrons. Since the select gate 411 of the selected memory cell is charged to the read selected word-select voltage (Vcc), the hot electrons are drawn toward the select gate 411. This allows a current (IDS) to flow through the channel region between the source line diffusion layer SLD and the bitline diffusion layer BLD on either side of the selected memory cell.

Figure 14:
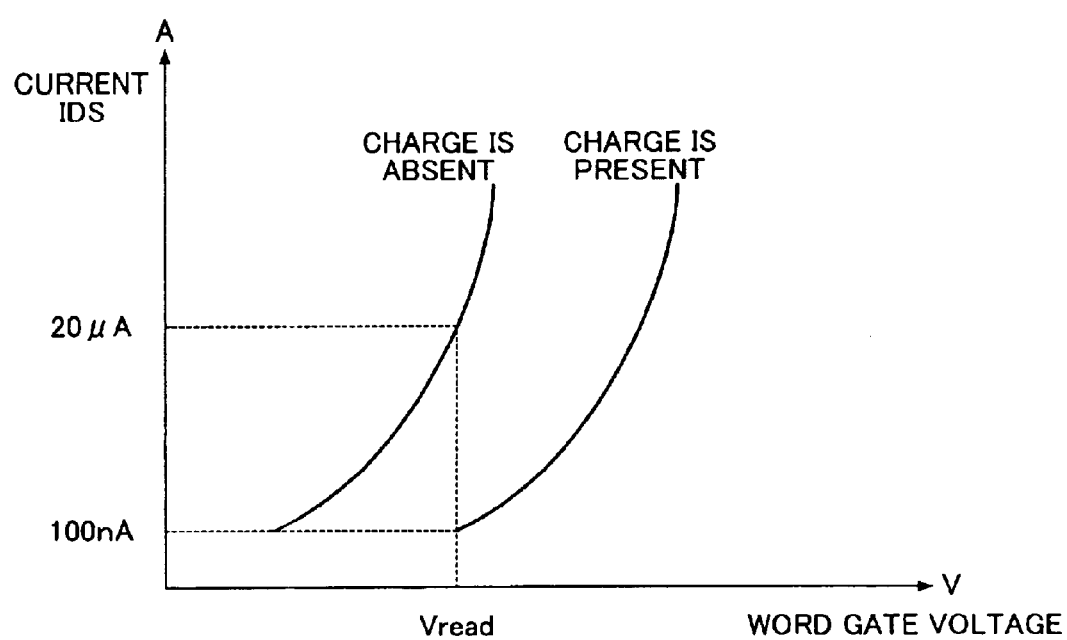
FIG. 14 is a graph showing the relation between the presence or absence of a charge in an ONO film and a flowing current.

The three-region structure consisting of the word gate 412, the ONO film 413, and the channel region of the memory cell 410 may be considered as a MOS transistor. The threshold value of the transistor becomes higher in a state in which a charge is trapped in the ONO film than in a state in which a charge is not trapped in the ONO film. FIG. 14 is a graph showing the relation between the presence or absence of a charge in an ONO film and a flowing current between the source line diffusion layer SLD and the bitline diffusion layer BLD.

In FIG. 14, in the case where a voltage Vread is applied to the word gate 412, about 20 $\mu$A of current IDS flows when a charge is not trapped in the ONO film, and the current IDS flows only to a small extent when a charge is trapped in the ONO film. Specifically, since the threshold value of the transistor increases when a charge is trapped in the ONO film, the current IDS flows only to a small extent if the voltage applied to the word gate 412 is the voltage Vread.

The data retained in the selected memory cell can be read by reading the amount of current by using a sense amplifier (not shown) disposed for each bitline 60.

This is the principle of reading data from the selected memory cell. The above-described read operation is a forward read. Specifically, a higher voltage is applied to the source line diffusion layer SLD than the bitline diffusion layer BLD in the same manner as in the program operation. A reverse read may also be used as a read method. In this case, the voltages applied to the source line diffusion layer SLD and the bitline diffusion layer BLD in the present embodiment are each replaced by the other.

Figure 13:
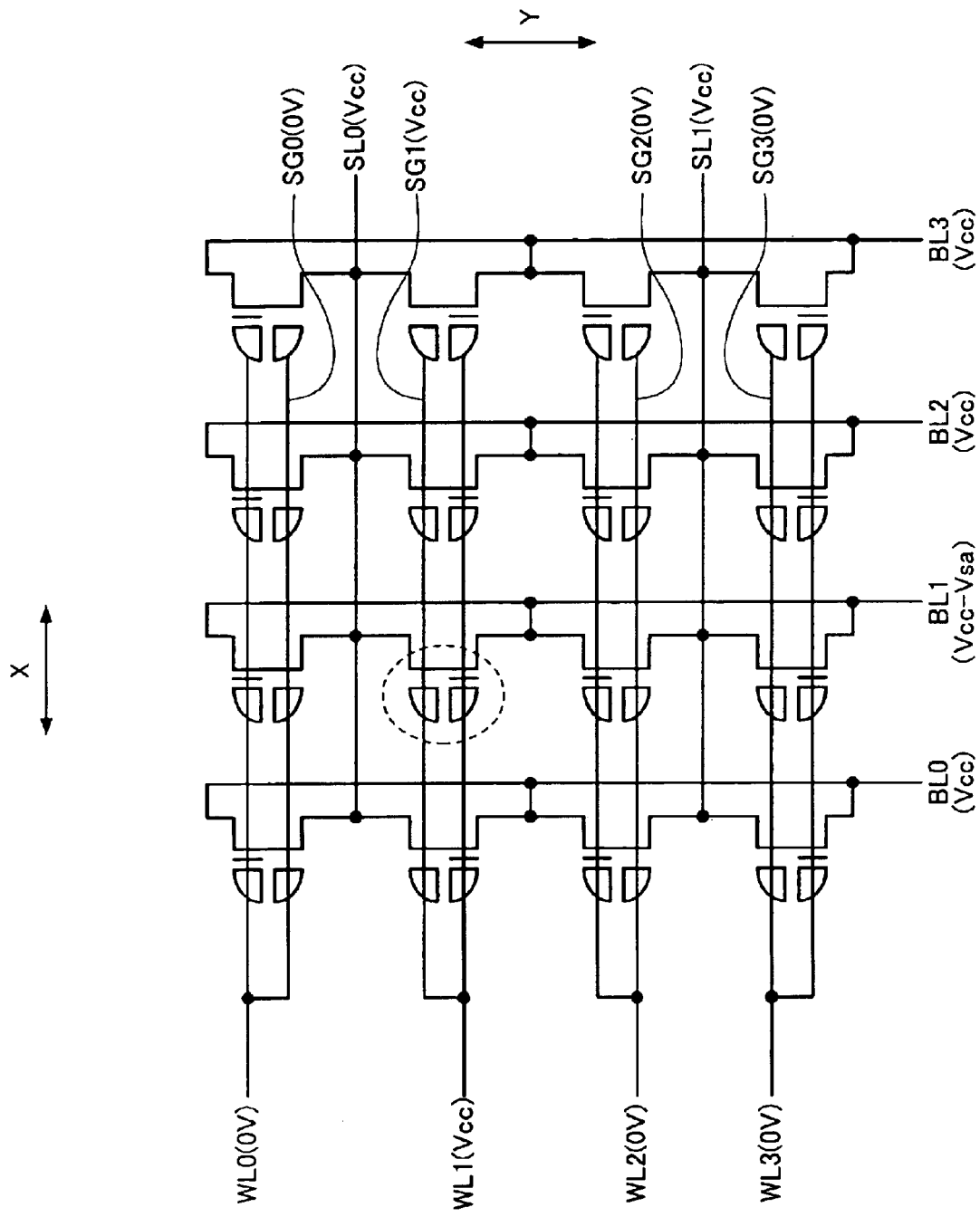
FIG. 13 is a view showing a voltage application state during reverse reading according to an embodiment of the present invention.

FIG. 13 is a view showing the voltage application state during reverse reading. The memory cell 410 encircled by a dotted line is a selected memory cell. In FIG. 13, the wordline WL1 (selected wordline) and the selectline SG1 (selected selectline) are charged to a reverse read selected word-select voltage (power supply voltage Vcc). All the source lines 80 including the source lines SL0 and SL1 are set at a reverse read selected source voltage (Vcc). The selected bitline including the bitline BL1 is set at a reverse read selected bit voltage (Vcc–Vsa), and other bitlines 60, that is, all the unselected bitlines in the selected memory block are set at a reverse read unselected bit voltage (Vcc). All the unselected wordlines including the wordlines WL0, WL2, and WL3 and all the unselected selectlines including the selectlines SG0, SG2, and SG3 are set at a reverse read unselected word-select voltage (0 V). The read substrate voltage (0 V) is applied to the substrate 414 in the selected memory block. The principle of reading data from the memory cell 410 is the same as in the forward read.

3. Comparison with Comparative Example and Effect

Figure 15:
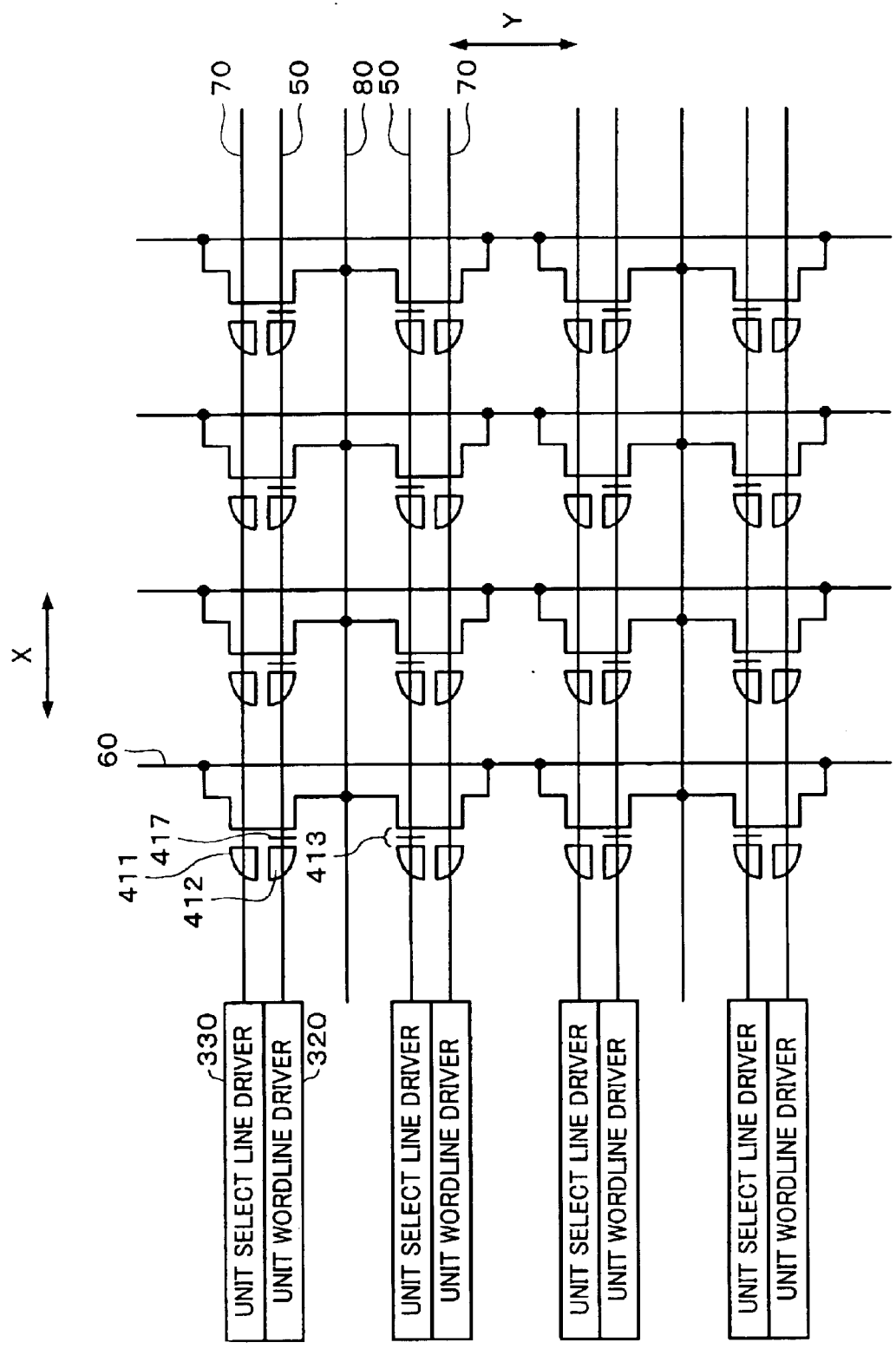
FIG. 15 is a view showing a part of a memory block in a first comparative example according to an embodiment of the present invention.

FIG. 15 is a view showing a part of the memory block 400 in a first comparative example. In FIG. 15, one wordline 50 and one selectline 70 are connected with each of the memory cells 410 in the memory block 400 in the first comparative example. The wordline 50 and the selectline 70 are respectively driven by a unit wordline driver section 320 and a unit selectline driver section 330. Specifically, in the first comparative example, the unit wordline driver sections 320 and the unit selectline driver sections 330 are necessary for the number of wordlines 50 and the number of selectlines 70 in the memory block 400. Moreover, since the interconnect pitch is limited, it is necessary to contrive the arrangement method in order to dispose a large number of driver sections. This results in an increase in the layout area.

In comparison with the first comparison example, in the present embodiment, since the unit wordline-and-selectline-driver-section 310 drives the wordline 50 and the selectline 70, it is unnecessary to separately provide a unit driver section exclusively for the selectline 70. Since a driver section exclusive for the selectline 70 can be omitted, the layout area can be designed to be significantly small.

Figure 16:
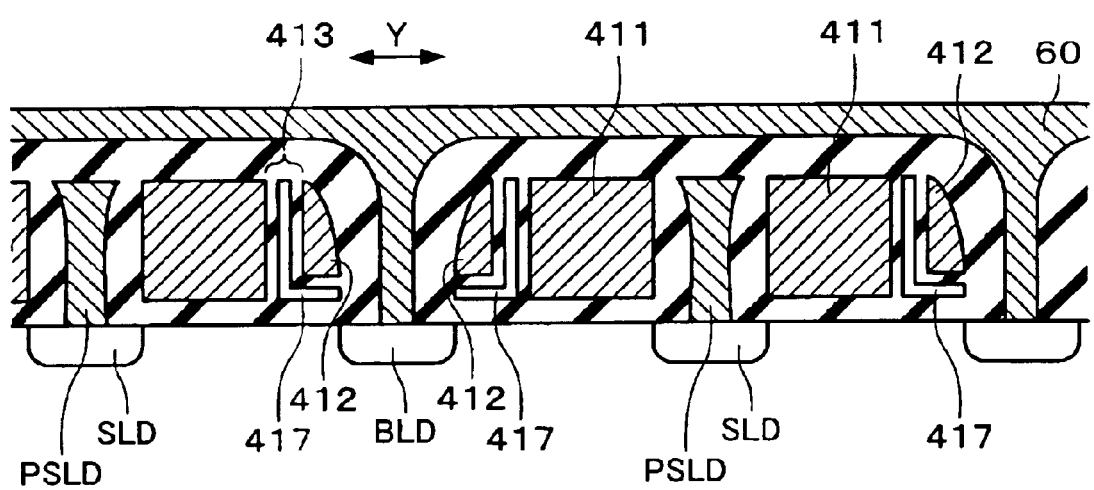
FIG. 16 is a cross-sectional view showing a memory block in a second comparative example according to an embodiment of the present invention.

FIG. 16 is a view showing the cross section of a part of the memory block 400 in a second comparative example. In FIG. 16, the select gate 411 is formed comparatively larger in the shape of a quadrilateral. On the contrary, in the present embodiment, the select gate 411 is formed in the shape of a sidewall (see FIG. 3). The area (conductor) which is not completely etched when etching the conductor stacked on the substrate remains as a sidewall. The sidewall may be used as the select gate 411. Specifically, in the present embodiment, the size of the memory cell 410 is reduced by forming the select gate 411 in the shape of a sidewall. This enables the die size of the memory cell array 400 to be reduced. As a result, the manufacturing cost can be significantly reduced.

4. Modification

Figure 17:
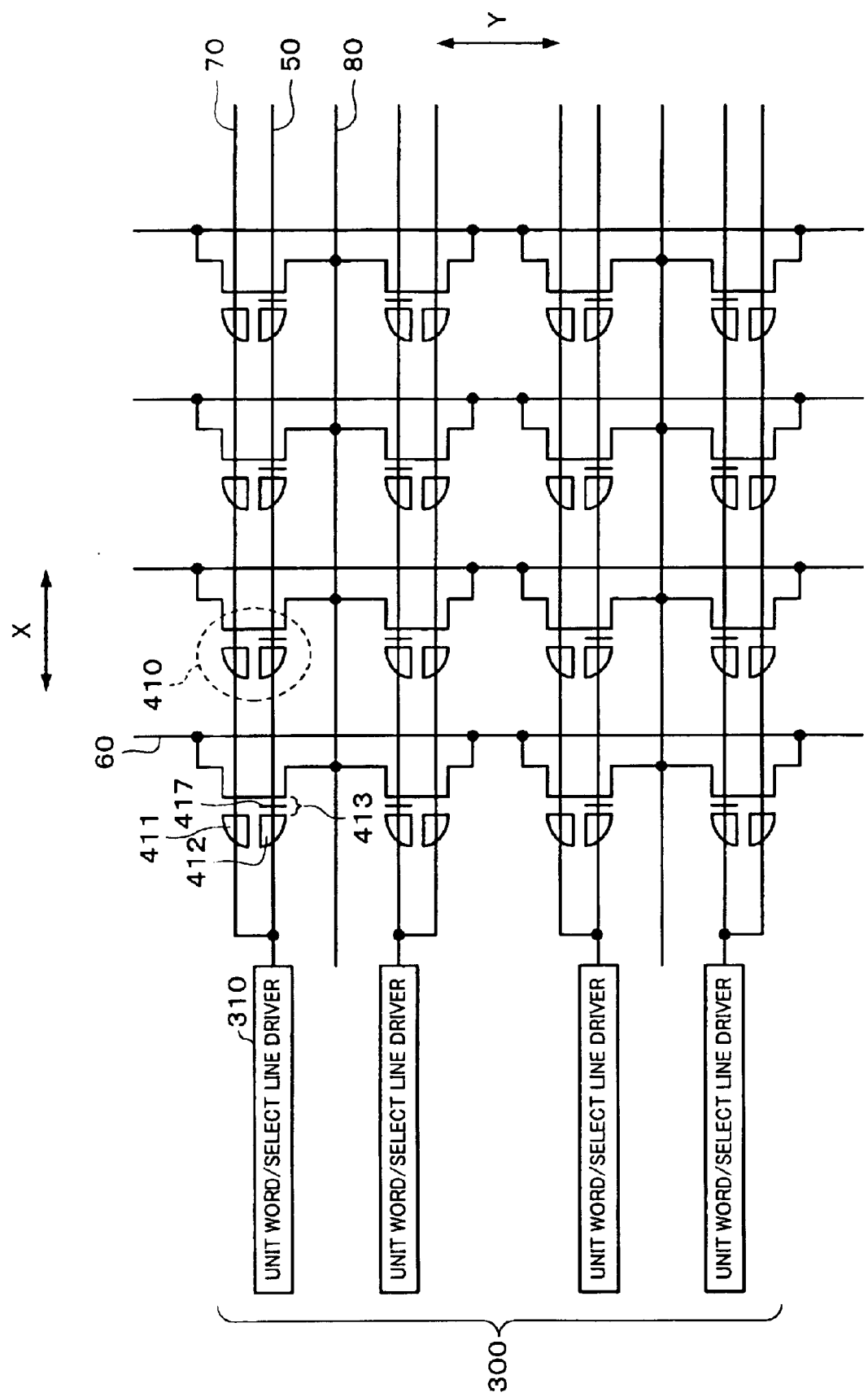
FIG. 17 is a view showing a part of a memory block 400 in a modification according to an embodiment of the present invention.
Figure 18:
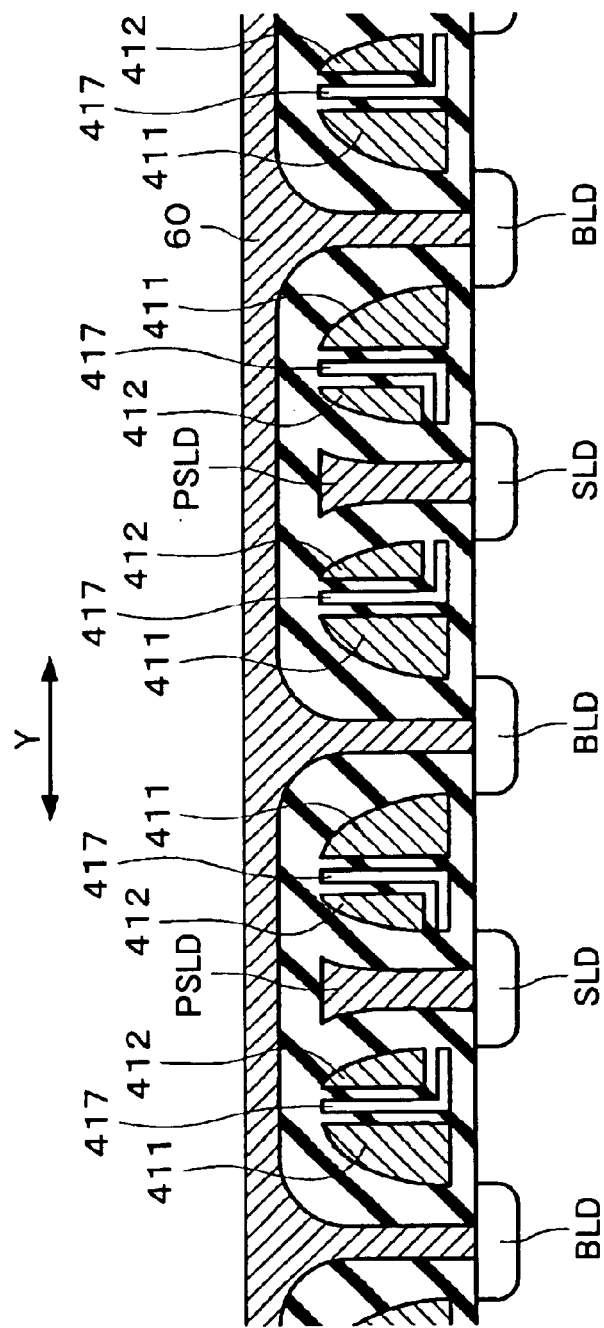
FIG. 18 is a cross-sectional view of a memory block in a modification according to an embodiment of the present invention.

FIG. 17 shows a modification according to the memory block 400 in the above embodiment. The modification has the same effects as the effects of the above embodiment. The modification differs from the above embodiment as to the arrangement direction of the select gate 411 and the word gate 412 of the memory cell 410 with respect to the bitline 60 and the source line 70. FIG. 18 shows the cross section of the memory block 400 along the column direction Y so that the feature of the modification is more readily understood.

Figure 19:
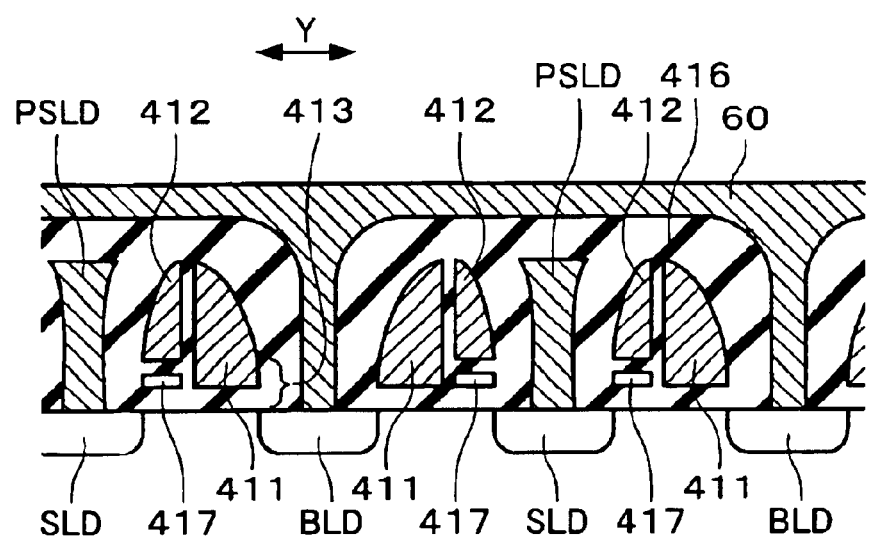
FIG. 19 is a cross-sectional view of another memory block in a modification according to an embodiment of the present invention.

In the modification shown in FIG. 18, the diffusion layer adjacent to the select gate 411 is the bitline diffusion layer BLD, and the diffusion layer adjacent to the word gate 412 is the source line diffusion layer SLD. In the modification, the contacts WSCNT (batting contacts) are alternately disposed on either side of the memory block 400 along the row direction X in the same manner as in the above embodiment. However, all the contacts WSCNT (batting contacts) may be uniformly disposed on one side. The wordline 50 and the selectline 70 may be connected with the unit wordline-and-selectline-driver-section 310 by separately disposing contacts for the word gate 412 (wordline 50) and the select gate 411 (selectline 70). The ONO film 417 of the memory cell 410 may be formed as shown in FIG. 19.

Figure 20:
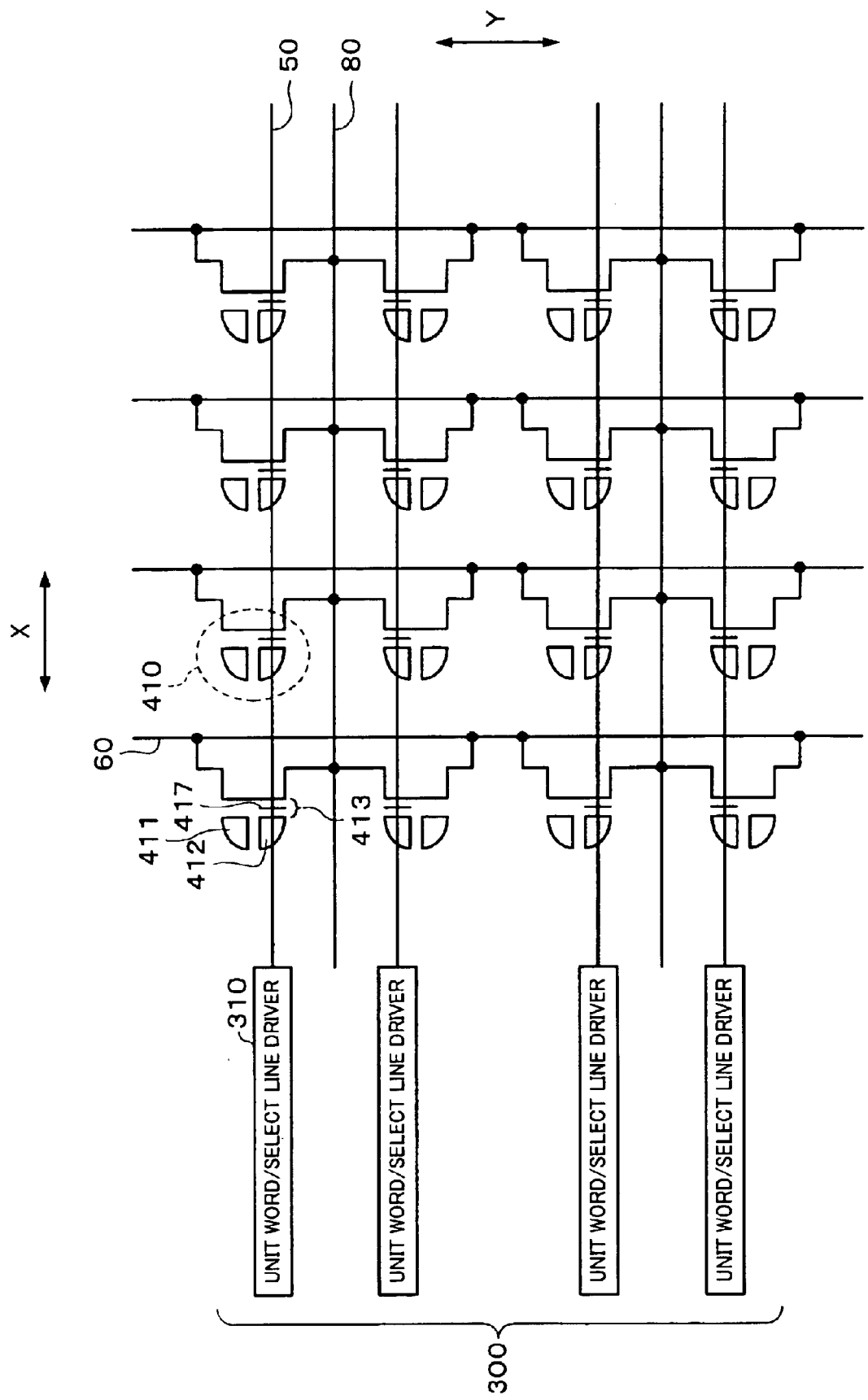
FIG. 20 is a view of a memory block when using a select gate floating method in a modification according to an embodiment of the present invention.

In FIG. 18, since the nitride film 417 of the memory cell is formed to extend between the select gate 411 and the word gate 412, the above-described select gate floating method may be used. In the modification, if a dielectric film which causes capacitive coupling to occur is formed between the select gate 411 and the word gate 412, the select gate floating method can be used. FIG. 20 is a view showing a part of the memory block 400 when using the select gate floating method in the modification.

The modification has the standby state, erase state, program state, and read state in the same manner as in the above embodiment. Each state is described below with reference to the drawings. FIGS. 21 to 25 show the voltage application states of the selected memory block. In the standby state, all the wordlines 50 (including the wordlines WL0 to WL3) and all the selectlines 70 (including the selectlines SG0 to SG3) in the memory cell array 4000 are set at a standby word-select voltage (0 V). All the bitlines 60 (including the bitlines BL0 to BL3) in the memory cell array 4000 are set at a standby bit voltage (0 V), and all the source lines 80 (including the source lines SL0 and SL1) in the memory cell array 4000 are set at a standby source voltage (0 V). The unselected memory block during each operation (erase, program, and read) is set at the same state as the standby state. The basic principle of each operation (erase, program, and read) is the same as that in the above embodiment.

Figure 21:
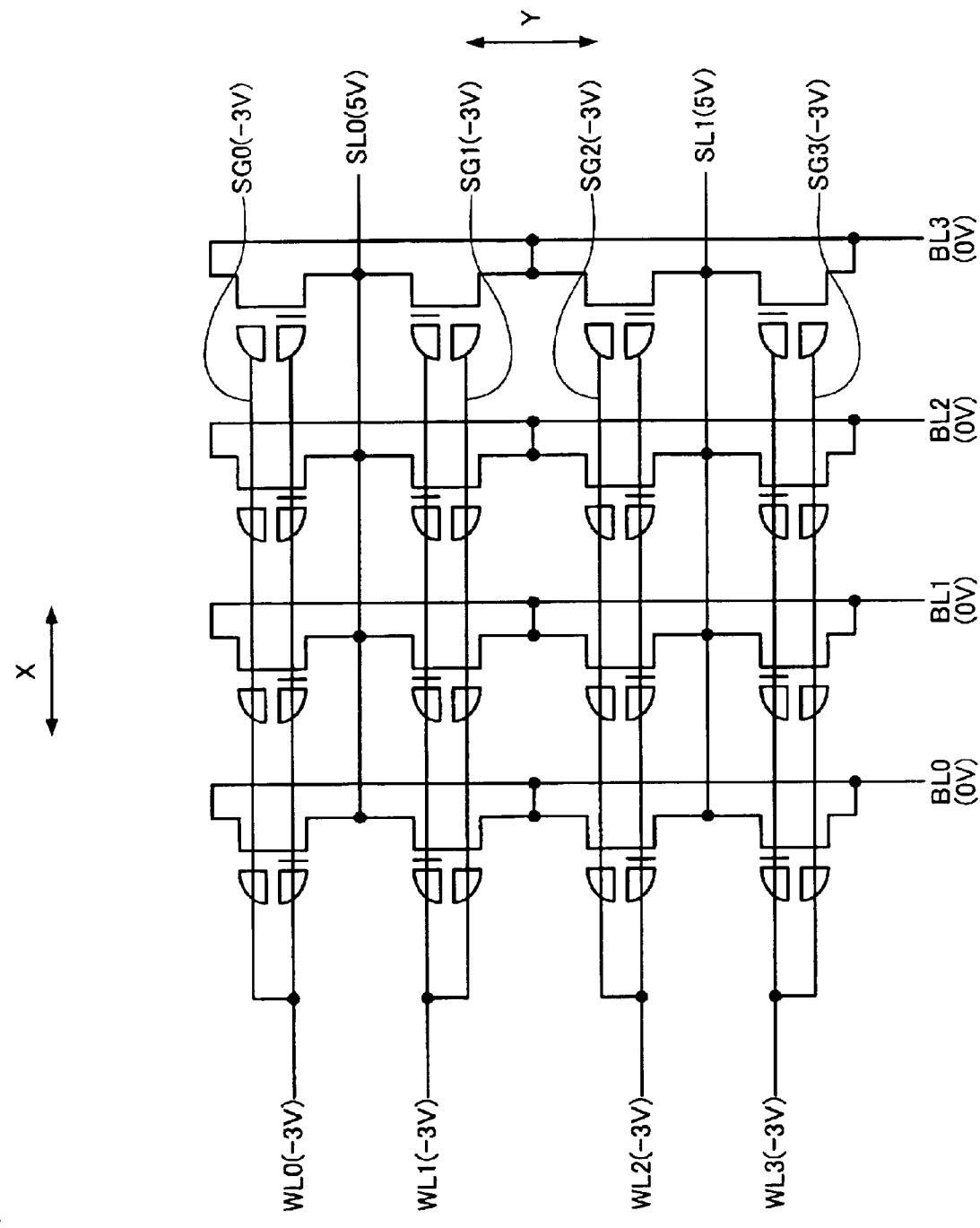
FIG. 21 is a view showing a voltage application state during erasing in a modification according to an embodiment of the present invention.

FIG. 21 is a view showing the voltage application state of a part of the selected memory block during erasing. All the wordlines 50 (including the wordlines WL0 to WL3) in the selected memory block and all the selectlines 70 (including the selectlines SG0 to SG3) in the selected memory block are set at an erase word-select voltage (−3 V). All the bitlines 60 (including the bitlines BL0 to BL3) in the selected memory block are set at an erase bit voltage (0 V). All the source lines 80 (including the source lines SL0 and SL1) in the selected memory block are set at an erase source voltage (5 V). An erase substrate voltage (0 V) is applied to the substrate 414 in the selected memory block.

Figure 22:
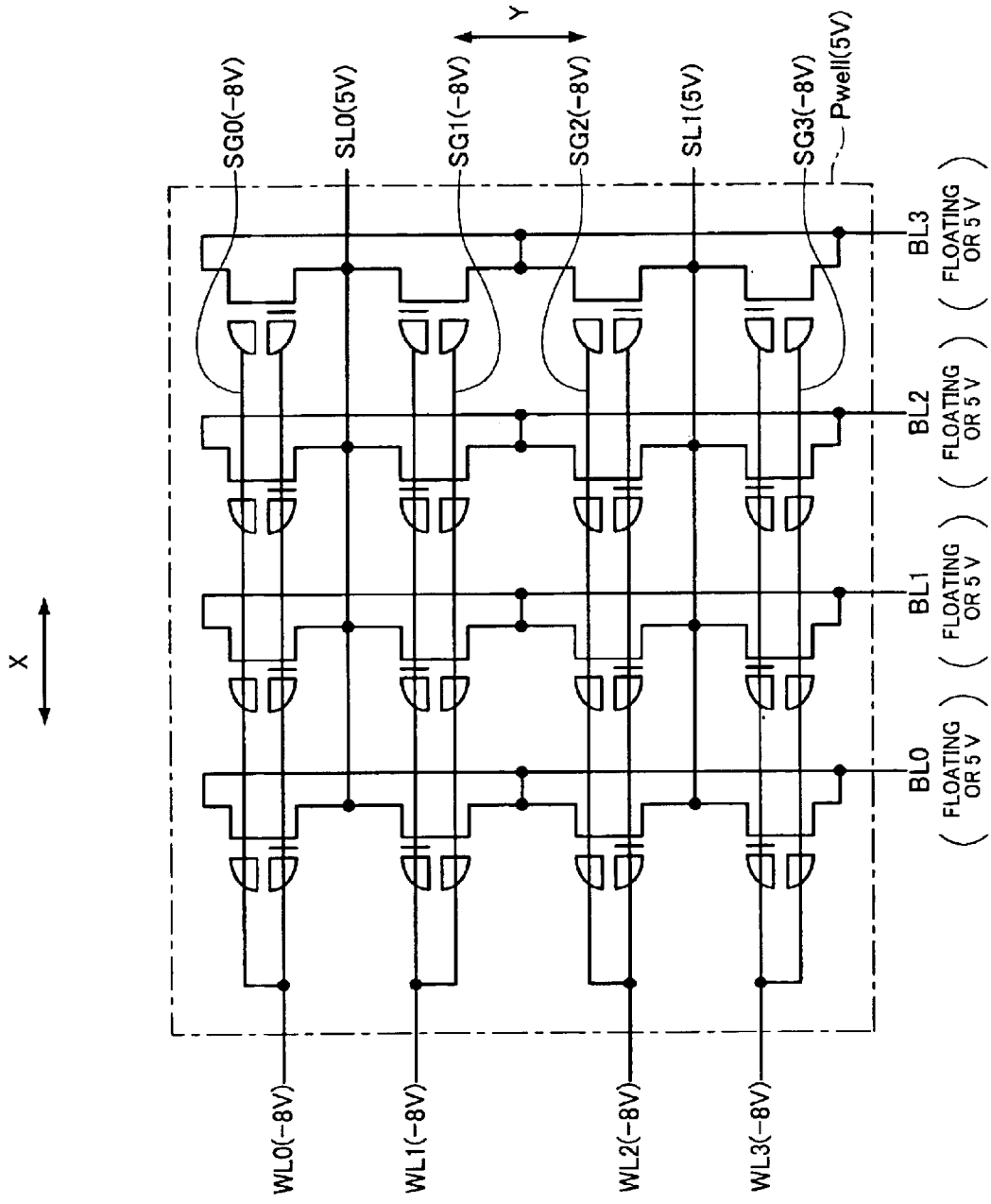
FIG. 22 is a view showing a voltage application state during FN erasing in a modification according to an embodiment of the present invention.

In the modification, the FN erase method may also be used as the erase method. FIG. 22 is a view showing the voltage application state when performing the erase operation by using the FN erase method. All the wordlines 50 (including the wordlines WL0 to WL3) and all the selectlines 70 (including the selectlines SG0 to SG3) in the selected memory block are set at an FN erase word-select voltage (−8 V). All the bitlines 60 (including the bitlines BL0 to BL3) in the selected memory block are set at a floating state or at an FN erase bit voltage (5 V). All the source lines 80 (including the source lines SL0 and SL1) in the selected memory block are set at an erase source voltage (5 V). An FN erase substrate voltage (5 V) is applied to the substrate 414 (symbol Pwell in FIG. 22) in the selected memory block.

Figure 23:
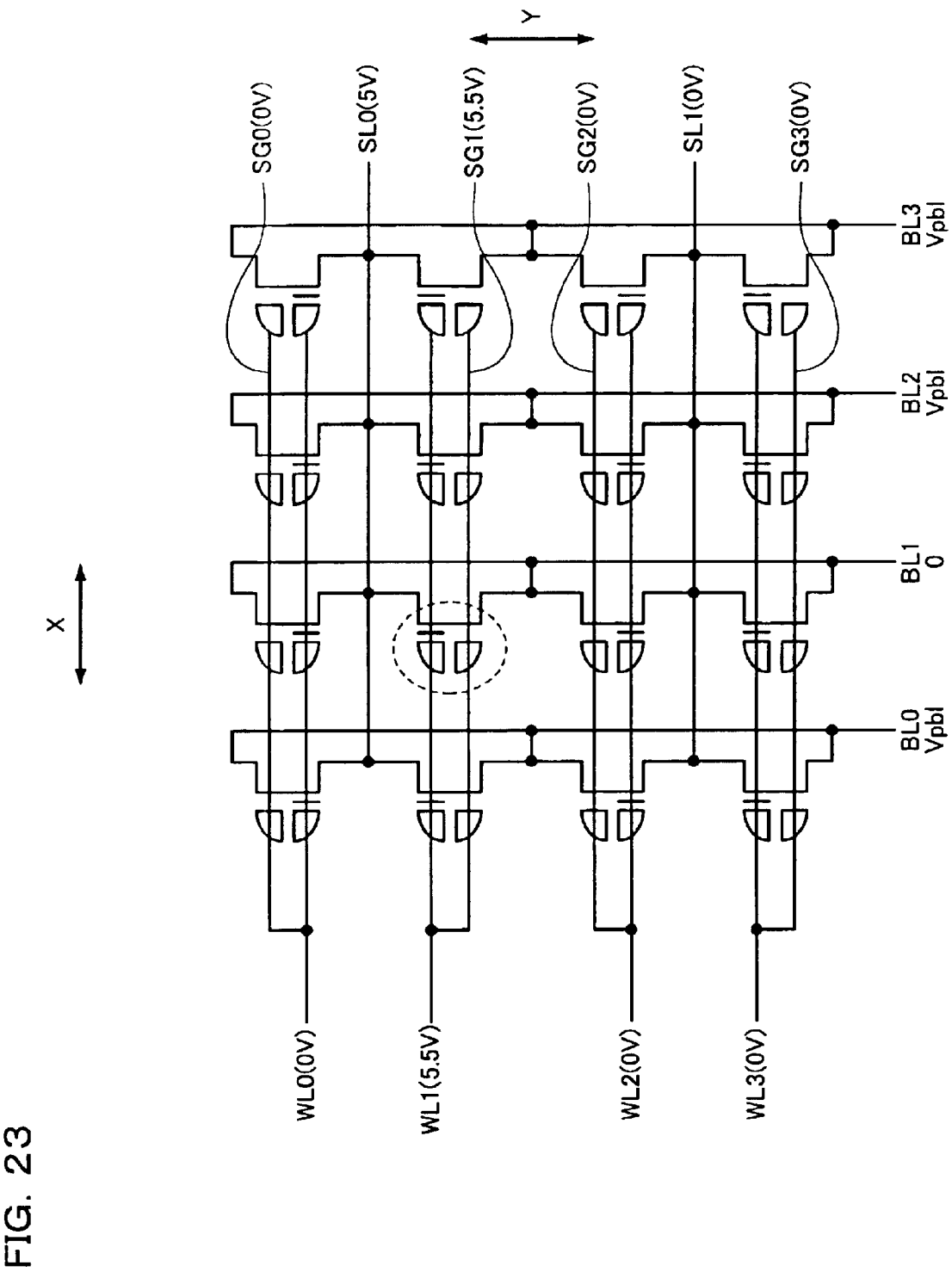
FIG. 23 is a view showing a voltage application state during programming in a modification according to an embodiment of the present invention.

FIG. 23 is a view showing the voltage application state of a part of the selected memory block during programming. The memory cell 410 encircled by a dotted line is a selected memory cell.

In FIG. 23, the wordline WL1 (selected wordline) and the selectline SG1 (selected selectline) are set at a program selected word-select voltage (5.5 V). The source line SL0 (selected source line) is set at a program selected source voltage (5 V), and all the unselected source lines in the selected memory block including the source line SL1 are set at a program unselected source voltage (0 V). All the selected bitlines including the bitline BL1 are set at a program selected bit voltage (0 V), and other bitlines 60, that is, all the unselected bitlines in the selected memory block are set at a program unselected bit voltage (Vpbl, about 5 V, for example). All the unselected wordlines in the selected memory block including the wordlines WL0, WL2, and WL3 and all the unselected selectlines in the selected memory block including the selectlines SG0, SG2, and SG3 are set at a program unselected word-select voltage (0 V). A program substrate voltage (0 V) is applied to the substrate 414 in the selected memory block.

Figure 24:
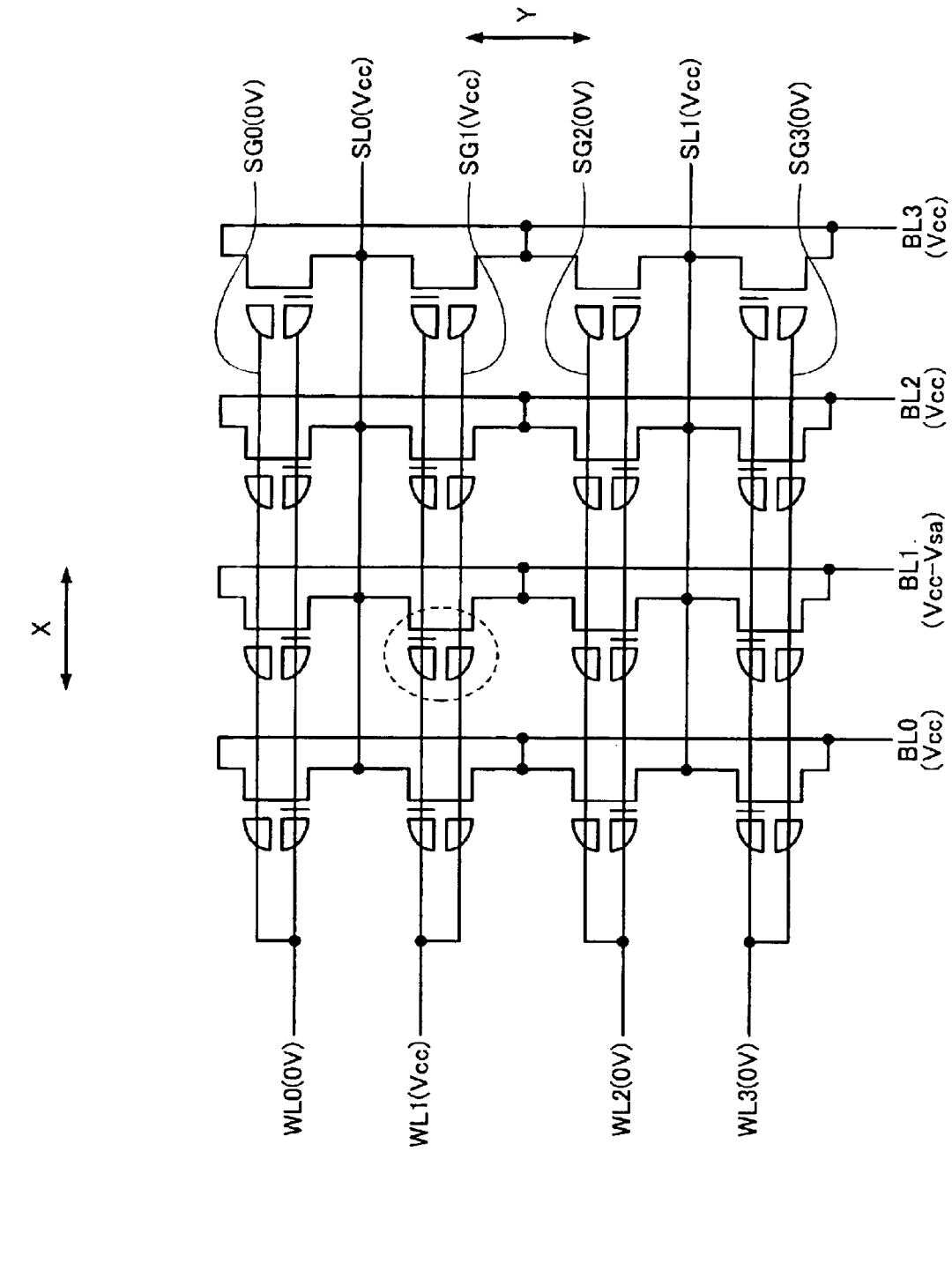
FIG. 24 is a view showing a voltage application state during forward reading in a modification according to an embodiment of the present invention.

FIG. 24 is a view showing the voltage application state of a part of the selected memory block during reading. The memory cell 410 encircled by a dotted line is a selected memory cell.

In FIG. 24, the wordline WL1 (selected wordline) and the selectline SG1 (selected selectline) are set at a read selected word-select voltage (power supply voltage Vcc). All the source lines 80 in the selected memory block including the source lines SL0 and SL1 are set at a read selected source voltage (Vcc). The selected bitline including the bitline BL1 is set at a read selected bit voltage (Vcc−Vsa), and all the unselected bitlines in the selected memory block are set at a read unselected bit voltage (Vcc). All the unselected wordlines in the selected memory block including the wordlines WL0, WL2, and WL3 and all the unselected selectlines in the selected memory block including the selectlines SG0, SG2, and SG3 are set at a read unselected word-select voltage (0 V). A read substrate voltage (0 V) is applied to the substrate 414 in the selected memory block. This read operation is the forward read. The reverse read may also be used in the modification in the same manner as in the above embodiment.

Figure 25:
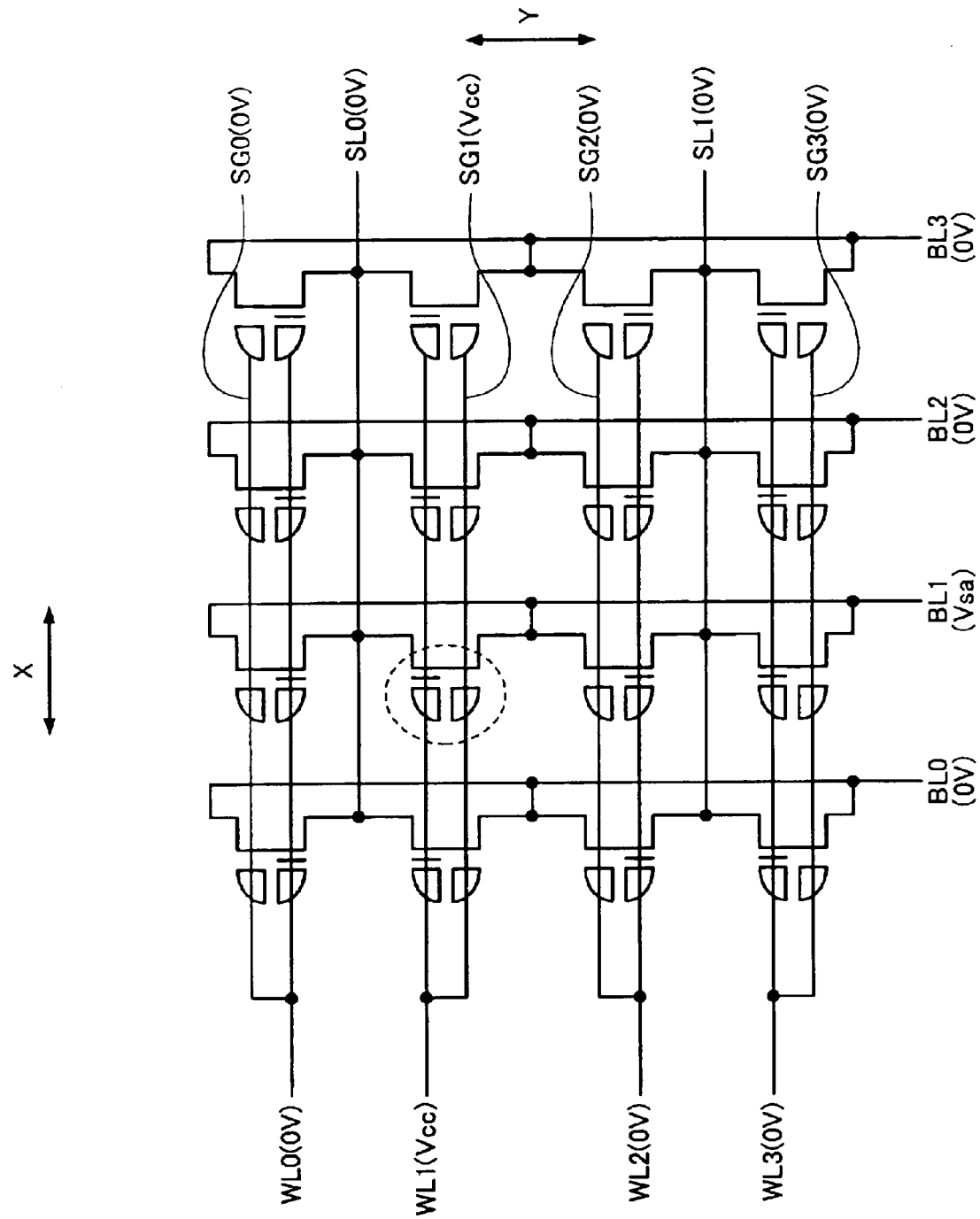
FIG. 25 is a view showing a voltage application state during reverse reading in a modification according to an embodiment of the present invention.

FIG. 25 shows the voltage application state during reverse reading. The memory cell 410 encircled by a dotted line is a selected memory cell. In FIG. 25, the wordline WL1 (selected wordline) and the selectline SG1 (selected selectline) are set at a reverse read selected word-select voltage (power supply voltage Vcc). All the source lines 80 in the selected memory block including the source lines SL0 and SL1 are set at a reverse read selected source voltage (0 V). The selected bitline including the bitline BL1 is set at a reverse read selected bit voltage (Vsa, 1 V, for example), and all the unselected bitlines in the selected memory block are set at a reverse read unselected bit voltage (0 V). All the unselected wordlines in the selected memory block including the wordlines WL0, WL2, and WL3 and all the unselected selectlines in the selected memory block including the selectlines SG0, SG2, and SG3 are set at a reverse read unselected word-select voltage (0 V). A read substrate voltage (0 V) is applied to the substrate 414 in the selected memory block.

The present invention can provide a nonvolatile semiconductor memory device having a small layout area as described above.

The present invention is not limited to the above-described embodiments. Various modifications and variations are possible without departing from the spirit and scope of the present invention.

What is claimed is:

1. A nonvolatile semiconductor memory device comprising a memory cell array in which a plurality of memory cells are arranged in a row direction and a column direction, wherein each of the memory cells includes a source region, a drain region, a channel region between the source region and the drain region, a word gate and a select gate disposed to face the channel region, and a nonvolatile memory element formed between the word gate and the channel region, wherein the memory cell array includes:

a plurality of wordlines, each of the wordlines being connected in common with the word gates of the memory cells arranged in the row direction;

a plurality of selectlines, each of the selectlines being connected in common with the select gates of the memory cells arranged in the row direction;

a plurality of bitlines, each of the bitlines being connected in common with the drain regions or the source regions of the memory cells arranged in the column direction;

a wordline-and-selectline driver section which drives the wordlines and the selectlines; and a bitline driver section which drives the bitlines, wherein the wordline-and-selectline-driver-section includes a plurality of unit wordline-and-selectline-driver-sections, and wherein each of the unit wordline-and-selectline driver sections drives the select gates and the word gates of the memory cells in each row at a single potential.

2. The nonvolatile semiconductor memory device as defined in claim 1, wherein a wordline among the wordlines and a selectline among the selectlines are short-circuited, the wordline and the selectline being connected with the same memory cells.

3. The nonvolatile semiconductor memory device as defined in claim 2, wherein an interconnect contact is provided over the wordline and the select line, and wherein the interconnect contact covers a part of an interconnect surface of the wordline and a part of an interconnect surface of the selectline.

4. The nonvolatile semiconductor memory device as defined in claim 1, wherein the word gate and the select gate are capacitively coupled in each of the memory cells.

5. The nonvolatile semiconductor memory device as defined in claim 4, wherein the wordline-and-selectline-driver-section supplies drive voltages to the wordlines or the selectlines connected with the memory cells.

6. The nonvolatile semiconductor memory device as defined in claim 4, wherein each of the unit wordline-and-selectline-driver-sections supplies drive voltages to a wordline among the wordlines or a selectline among the selectlines connected with the same memory cells.

7. The nonvolatile semiconductor memory device as defined in claim 4, wherein the nonvolatile memory element is formed to extend between the word gate and the select gate of each of the memory cells.

8. The nonvolatile semiconductor memory device as defined in claim 1, wherein the nonvolatile memory element is formed of an ONO film which includes two oxide films (O) and a nitride film (N) between the two oxide films (O).

9. The nonvolatile semiconductor memory device as defined in claim 1, wherein each of the memory cells includes a first region and a second region in the channel region, the first region being adjacent to the source region, and the second region being adjacent to the drain region, and wherein the select gate is disposed over the first region, and the word gate is disposed over the second region with the nonvolatile memory element interposed in between.

10. The nonvolatile semiconductor memory device as defined in claim 1, wherein each of the memory cells includes a first region and a second region in the channel region, the first region being adjacent to the source region, and the second region being adjacent to the drain region, and wherein the word gate is disposed over the first region with the nonvolatile memory element interposed in between, and the select gate is disposed over the second region.

* * * * *

UNITED STATES PATENT AND TRADEMARK OFFICE
CERTIFICATE OF CORRECTION

PATENT NO. : 6,934,191 B2
DATED : August 23, 2005
INVENTOR(S) : Yoshihito Owa

It is certified that error appears in the above-identified patent and that said Letters Patent is hereby corrected as shown below:

<u>Title page,</u>
Item [75], Inventor, replace with:
-- Yoshihito Owa, Hakushu-machi (JP) --.
Item [30], Foreign Application Priority Data, replace with:
-- Feb. 28, 2003     (JP) ............2003-054450 --.

Signed and Sealed this

Twenty-ninth Day of November, 2005

JON W. DUDAS
*Director of the United States Patent and Trademark Office*